United States Patent
Whetsel

(10) Patent No.: US 8,621,297 B2
(45) Date of Patent: Dec. 31, 2013

(54) SCAN PATH SWITCHES SELECTIVELY CONNECTING INPUT BUFFER AND TEST LEADS

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/891,885

(22) Filed: May 10, 2013

(65) Prior Publication Data

US 2013/0254607 A1   Sep. 26, 2013

Related U.S. Application Data

(62) Division of application No. 13/591,347, filed on Aug. 22, 2012, now Pat. No. 8,464,109, which is a division of application No. 13/352,484, filed on Jan. 18, 2012, now Pat. No. 8,281,194, which is a division of application No. 13/042,875, filed on Mar. 8, 2011, now Pat. No. 8,122,310, which is a division of application No. 12/495,924, filed on Jul. 1, 2009, now Pat. No. 7,925,951, which is a division of application No. 12/182,305, filed on Jul. 30, 2008, now Pat. No. 7,574,641, which is a division of application No. 11/759,560, filed on Jun. 7, 2007, now Pat. No. 7,451,370, which is a division of application No. 10/806,539, filed on Mar. 23, 2004, now Pat. No. 7,257,749, which is a division of application No. 09/745,523, filed on Dec. 21, 2000, now Pat. No. 6,731,106, which is a division of application No. 09/049,626, filed on Mar. 27, 1998, now Pat. No. 6,199,182.

(60) Provisional application No. 60/041,729, filed on Mar. 27, 1997.

(51) Int. Cl.
*G01R 31/28* (2006.01)

(52) U.S. Cl.
USPC ............... 714/726; 326/16; 324/762.01

(58) Field of Classification Search
USPC ............ 714/724, 726, 727, 729; 326/16; 324/762.01
See application file for complete search history.

(56) References Cited

U.S. PATENT DOCUMENTS 5,070,296 A * 12/1991 Priebe .................... 324/73.1
5,150,047 A * 9/1992 Saito et al. .............. 324/537

(Continued)

OTHER PUBLICATIONS

Wang, F.C.;, "A simulation based strategy for mixed-signal testing," ASIC Conference and Exhibit, 1992., Proceedings of Fifth Annual IEEE International, vol., no., pp. 363-367, Sep. 21-25, 1992.*

(Continued)

*Primary Examiner* — Cynthia Britt
(74) *Attorney, Agent, or Firm* — Lawrence J. Bassuk; Wade J. Brady, III; Frederick J. Telecky, Jr.

(57) ABSTRACT

The peripheral circuitry (350, 360, ESD, BH) of an integrated circuit die on a wafer is tested without physically contacting the bond pads of the die.

3 Claims, 20 Drawing Sheets

(56) References Cited

U.S. PATENT DOCUMENTS

| | | | | |
|---|---|---|---|---|
| 5,590,275 | A | * | 12/1996 | Van Berkel et al. ............ 714/30 |
| 5,659,257 | A | * | 8/1997 | Lu et al. .................... 324/750.3 |
| 5,968,191 | A | * | 10/1999 | Thatcher et al. ............. 714/723 |
| 6,199,182 | B1 | * | 3/2001 | Whetsel ........................ 714/724 |
| 8,281,194 | B2 | * | 10/2012 | Whetsel ........................ 714/726 |
| 8,464,109 | B2 | * | 6/2013 | Whetsel ........................ 714/726 |

OTHER PUBLICATIONS

Wang, F.C.;, "Design and test of mixed-signal VSLI," Electrical and Computer Engineering, 1993. Canadian Conference on, vol., no., pp. 461-464 vol. 1, Sep. 14-17, 1993.*

Schneider, B.; Soegaard, S.;, "IntegraTEST: the new wave in mixed-signal test," Test Conference, 1995. Proceedings., International, vol., no., pp. 750-760, Oct. 21-25, 1995.*

* cited by examiner

SELECT = CONVENTIONAL OR WARP SCAN MODE
MODE = CONVENTIONAL BC NORMAL OR TEST MODE CONTROL
CSU = CONVENTIONAL BC CAPTURE, SHIFT, UPDATE CONTROL

US 8,621,297 B2

SCAN PATH SWITCHES SELECTIVELY CONNECTING INPUT BUFFER AND TEST LEADS

CROSS-REFERENCE TO RELATED APPLICATIONS

This application is a divisional of application Ser. No. 13/591,347, filed Aug. 22, 2012, now U.S. Pat. No. 8,464, 109, issued Jun. 11, 2013;

Which was a divisional of application Ser. No. 13/352,484, filed Jan. 18, 2012, now U.S. Pat. No. 8,281,194, issued Oct. 2, 2012;

Which was a divisional of application Ser. No. 13/042,875, filed Mar. 8, 2011, now U.S. Pat. No. 8,122,310, issued Feb. 21, 2012;

Which was a divisional of application Ser. No. 12/495,924, filed Jul. 1, 2009, now U.S. Pat. No. 7,925,951, issued Apr. 12, 2011;

Which was a divisional of application Ser. No. 12/182,305, filed Jul. 30, 2008, now U.S. Pat. No. 7,574,641, issued Aug. 11, 2009;

Which was a divisional of application Ser. No. 11/759,560, filed Jun. 7, 2007, now U.S. Pat. No. 7,451,370, issued Nov. 11, 2008;

Which was a divisional of application Ser. No. 10/806,539, filed Mar. 23, 2004, now U.S. Pat. No. 7,257,749, issued Aug. 14, 2007;

Which was a divisional of application Ser. No. 09/745,523, filed Dec. 21, 2000, now U.S. Pat. No. 6,731,106, issued May 4, 2004;

Which was a divisional of application Ser. No. 09/049,626, filed Mar. 27, 1998, now U.S. Pat. No. 6,199,182, issued Mar. 6, 2001;

Which claimed priority from Provisional Application No. 60/041,729, filed Mar. 27, 1997.

STATEMENT REGARDING FEDERALLY SPONSORED RESEARCH OR DEVELOPMENT

Not applicable.

BACKGROUND OF THE DISCLOSURE

The present Disclosure relates generally to testing an integrated circuit die on a wafer without physically probing its bond pads and, more particularly, to testing the pad buffers, electrostatic discharge protection circuitry, and pad bus holders of the die without physically probing the bond pads.

Scan testing of circuits is well known. Scan testing configures the circuit into scan cells and combinational logic. Once so configured, the scan cells are controlled to capture test response data from the combinational logic, then shifted to unload the captured test response data from the combinational logic and to load the next test stimulus data to apply to the combinational logic.

FIG. 1 shows an electrical circuit having three memories (M) A,B,C and combinational logic (CL). FIG. 2 shows an example of the memories of FIG. 1 implemented as D flip flops (FF), each memory having a data input, data output, and clock and reset control signals. FIG. 3 shows one example of how the circuit of FIG. 1 can be made scan testable by converting the memories into scan cells and connecting the outputs (D,E,F) of the combinational logic to the scan cell capture inputs. FIG. 4A shows an example of how a D flip flop based memory is converted into a scan cell. The scan cells have a 3:1 multiplexer input to the flip flop. The multiplexer receives selection control (S) to: (1) input the output of the combinational logic to the flip flop (Input1, the capture input), (2) input the external input to the flip flop (Input2, the functional input), or (3) input the serial input to the flip flop (SI, the shift input). The flip flop receives a clock (C) and a reset (R) control input. The scan cells are connected together via their serial input (SI) and serial output (SO) to form a 3-bit scan path through the circuit of FIG. 3. The three scan cells operate as the state memories during functional operation. During test operation, the scan cells operate as scan cells to allow inputting test stimulus to the combinational logic and capturing the response output from the combinational logic. While edge sensitive D flip flop memories are used in this disclosure, level sensitive memories could be used as well. Converting level sensitive memories into scan memories is well known.

In the FIG. 3 example, the scan cells perform both the input of stimulus to the combinational logic and the capture of response from the combinational logic. In other examples of how the circuit may be made scan testable, scan cells could be added to the circuit and scan path, and coupled to the outputs of the combinational logic, as shown in the dotted boxes in FIG. 3. This would allow the input stimulus to be supplied by the converted scan cells (A,B,C) and the output response captured by the added scan cells. Adding scan cells for the purpose of capturing response data adds circuitry. Also if scan cells are added to capture the combinational logic response, the converted scan cells A,B,C do not need Input1 and the feedback connections from the combinational logic outputs.

Also in FIG. 3 a bypass memory (BM) is shown to allow a single bit bypass scan path through the circuit from SI to SO. The use of scan bypass memories is well known. An example of the bypass memory is shown in FIG. 4B. In addition to providing conventional bypassing of the circuit, the bypass memory of the present Disclosure is required to maintain its present state during capture operations, and to always load data from SI regardless of whether it is selected between SI and SO or not. The multiplexer of the bypass memory and the selection (S) control it receives allow these two requirements to be met.

FIG. 5 shows three of the circuits of FIG. 3 connected in series to a tester. The tester outputs data to the serial input of the first circuit (C1) and receives data from the serial output of the last circuit (C3). The tester outputs control to all three circuits to regulate their scan cell's capture and shift operations during each scan test cycle.

FIG. 6 shows the concept of conventional scan testing. In FIG. 6, N circuits are connected on a scan path. A tester controls all circuits C1-N to reset. Following reset, the tester controls all circuits C1-N to capture the first response data to the reset stimulus data. Next the tester controls all circuits C1-N to shift out the first captured response data and shift in the second stimulus data. This process of capturing response data, shifting out the response data while new stimulus data is shifted in is repeated for the number of patterns (P) required to test each of the circuits 1-N. As the number of serially connected circuits (N) grows, so does the length (L) of the scan path the tester needs to traverse during each capture/shift cycle. The test time in clocks, using conventional scan testing, is equal to the sum of the scan path lengths (L) of each circuit (N) in the scan path times the number of patterns (P) to be applied.

Example 1 shows how three circuits (C1, C2, and C3) are conventionally scan tested by a tester as shown in FIG. 5. The combinational logic decode for each of the circuits C1, C2, and C3 are shown in the Tables of Example 1. The tables show the present state (PS) output (i.e. stimulus) of the scan cells (ABC) to the combinational logic and the next state (NS)

input (i.e. response) to the scan cells (ABC) from the combinational logic. At the beginning of the test, the tester outputs control to reset all scan cells to a first present state (PS1). Next, the tester outputs control to all scan cells to do a first capture (CP1) of the response output of the combinational logic (CL) to the PS1 stimulus. Next, the tester outputs control to do a first 9-bit shift operation (SH1) to unload the first captured response data from each circuit's scan cells and to load the second present state (PS2) stimulus data to each circuit's scan cells. Next, the tester does a second capture (CP2) to load the scan cells with the response data from the second present state (PS2) stimulus data, then does a second 9-bit shift (SH2) to unload the second captured response data and load the third stimulus data. Next, the tester does a third capture (CP3) to load the scan cells with the response data from the third present state (PS3) stimulus data, then does a third 9-bit shift (SH3) to unload the third captured response data and load the fourth stimulus data (11). This process continues through an eighth capture (CP8) to load the scan cells with the response data from the eighth present state (PS8) stimulus data, then does an eighth 9-bit shift (SH8) to unload the final captured response data. The data input to the scan cells during the eighth shift (SH8) can be don't care data (x) since testing is complete following the eighth shift. If all circuits are good the response shifted out for each PS1-8 stimulus will match the expected response as shown in the tables for C1, C2, and C3. The number of test clocks for the conventional scan testing of the circuits in example 1 is the sum of the capture clocks (CP1-8) and shift clocks (SH1-8), or 8+(8×9)=80.

It is desirable to scan test electrical circuits in less time than the conventional approach.

The present Disclosure accelerates scan testing by re-using one circuit's scan test response data as scan test stimulus data for another circuit.

DETAILED DESCRIPTION OF THE DRAWINGS

Figure 7:
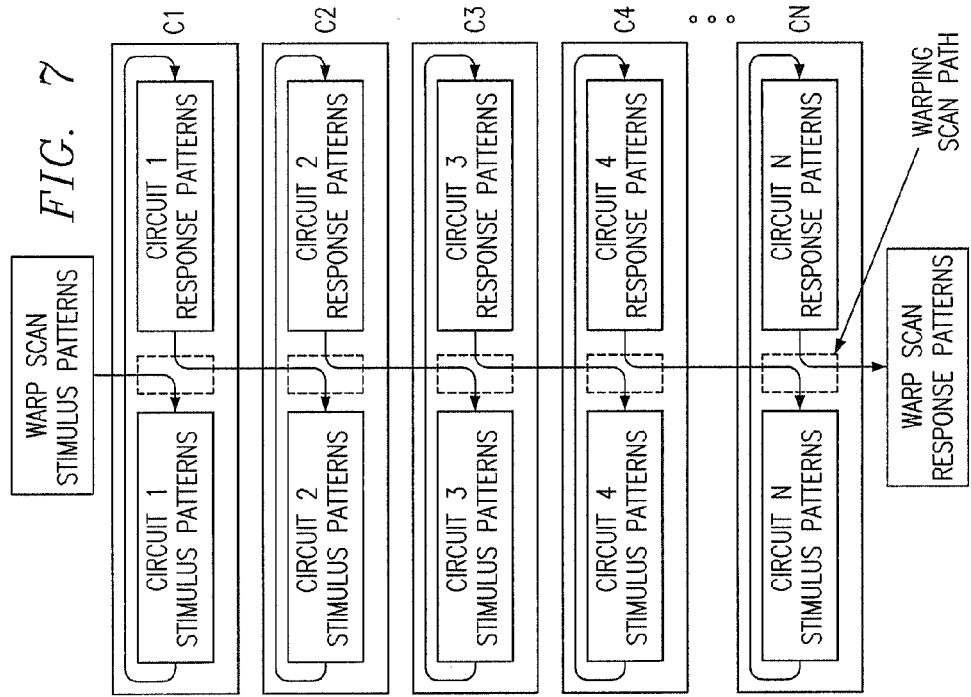
FIG. 7 is a block diagram of N circuits connected on a scan path according to the disclosed invention.
Figure 6:
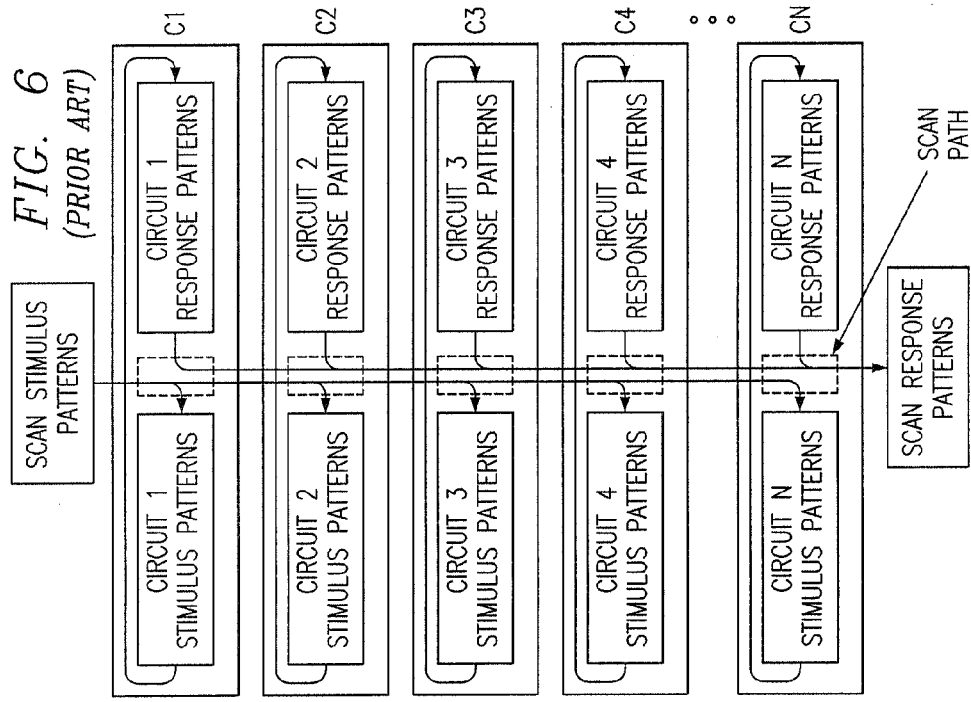
FIG. 6 is a block diagram of N circuits connected on a scan path in a known manner.

FIG. 7 shows the warping scan test concept of the present Disclosure. The term warping is used to indicate the non-conventional way serial data propagates through circuits during scan testing according to the present Disclosure. In FIG. 7, N circuits are connected on a scan path. A tester controls all circuits C1-N to reset. Following reset, the tester controls all circuits C1-N to capture the first response data to the reset stimulus data. Next the tester controls all circuits C1-N to shift data, but only for the length of the first circuit's (C1) scan path. After the first shift operation, C1's scan path is loaded with stimulus data from the tester and C2-CN's scan path is loaded with the response data from C1-CN−1. During the next capture and shift operation, C1 outputs response data to downstream circuits and receives its next stimulus data from the tester. After the second capture and shift operation, C1 contains its second stimulus data pattern from the tester and C2-CN contain their second stimulus patterns derived from the response output from leading circuits C1-CN−1. This process continues until C1 is tested. After C1 is tested, it is bypassed so that the tester can directly input any remaining stimulus to C2 and allow response from C2 to ripple downstream as stimulus to trailing circuits C3-CN. Similarly, after C2 is tested, it is bypassed to allow direct input of remaining stimulus to C3 while response from C3 is rippled downstream as stimulus to trailing circuits C4-CN. The overall testing of circuits C1-CN in FIG. 7 is complete when all circuits have received their required input stimulus, either indirectly as a result of output response from leading circuits or by direct input from the tester, and have output their response to the tester.

Figure 8:
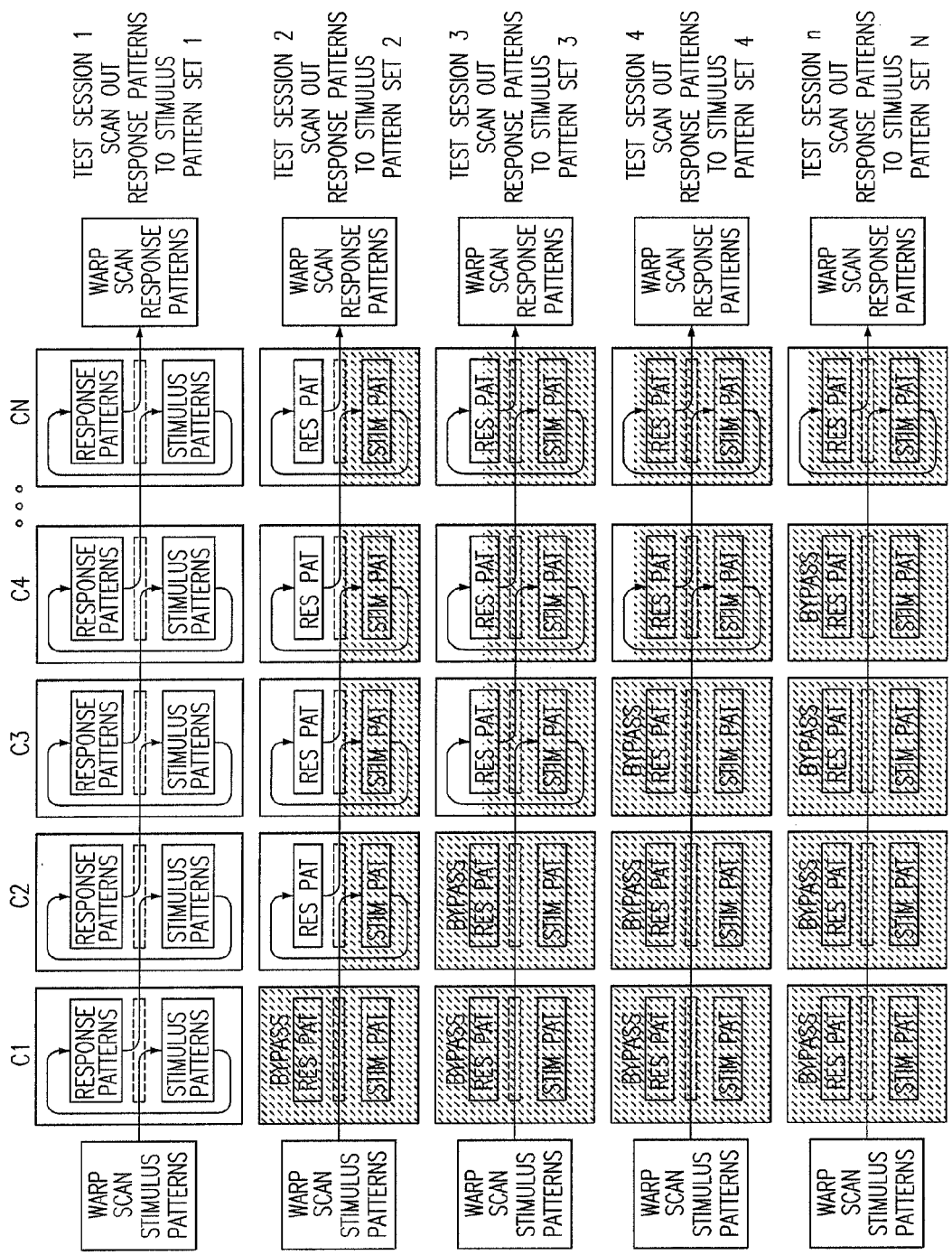
FIG. 8 is a block diagram of N circuits connected on a scan path and depicting N progressive scan test patterns.

FIG. 8 shows a conceptual flow of the above described warping scan test operation as it progresses across circuits C1-CN. The test sessions of FIG. 8 indicate times when a tester is inputting stimulus to a given circuit scan path, either directly to C1 or through tested and bypassed circuits (C1-CN−1). The shaded area in each circuit C1-CN indicates reduction of remaining stimulus input to a circuit following a given test session. When a circuit is completely tested, it is shown to be bypassed and completely shaded. The progression of the shaded areas of each circuit indicate the test acceleration anticipated by the present Disclosure. For example, following test session 1 (C1 tested), the response generated to downstream circuits C2-CN during test session 1 has reduced their need for additional stimulus patterns from the tester by 50%. Following test session 2 (C2 tested), the response generated to downstream circuits C3-CN during test session 2 has reduced their need for additional stimulus patterns from the tester by another 50%. And so on. The present Disclosure will show that scan test time can be dramatically reduced by using output response from leading circuits as stimulus input to trailing circuits which can reduce or even eliminate the need of stimulus input from the tester.

Figure 4A:
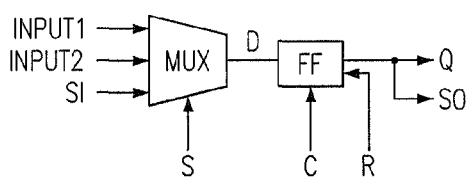
FIGS. 4A and 4B are block diagrams of a bypass memory of FIG. 3.
Figure 4B:
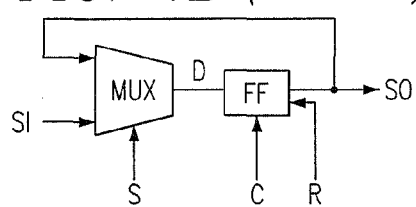

Example 2 shows how the same three circuits (C1,C2,C3) of Example 1 would be tested using the warping scan test concept whereby response data from leading circuits is used as stimulus data in trailing circuits. At the beginning of the test, the tester outputs control to reset or initialize all scan cells to a first present state 1 (PS1). Note that while a reset input is provided on the scan cells to allow the tester to initialize the scan paths by a reset control signal (as seen in FIG. 4A), the tester could also initialize non-resetable scan cells by doing a scan operation. Next, the tester outputs control to all scan cells to do a first capture (CP1) of the response output of the combinational logic (CL) to the first present state (PS1) stimulus. The tester then outputs control to cause all scan cells of circuits C1 through C3 to do a first 3-bit shift operation (SH1). The first 3-bit shift operation unloads the first captured 3-bit response data from C3, moves the first captured 3-bit response data from C1 to C2 and from C2 to C3, and loads the second 3-bit stimulus data into C1.

Next, the tester outputs control to all scan cells to do a second capture (CP2) of the response output of the combinational logic (CL) to the PS2 stimulus. The tester then outputs control to cause all scan cells of circuits C1 through C3 to do a second 3-bit shift operation (SH2). The second 3-bit shift operation unloads the second captured 3-bit response data from C3, moves the second captured 3-bit response data from C1 to C2 and from C2 to C3, and loads the third 3-bit stimulus data into C1.

Next, the tester outputs control to all scan cells to do a third capture (CP3) of the response output of the combinational logic (CL) to the PS3 stimulus. The tester then outputs control to cause all scan cells of circuits C1 through C3 to do a third 3-bit shift operation (SH3). The third 3-bit shift operation unloads the third captured 3-bit response data from C3, moves the third captured 3-bit response data from C1 to C2 and from C2 to C3, and loads the fourth 3-bit stimulus data into C1.

This capture and shift process repeats until the seventh shift operation (SH7). During SH7, the tester unloads the seventh captured 3-bit response from C3, moves the seventh captured 3-bit response data from C1 to C2 and from C2 to C3, and loads the eighth, and last, 3-bit stimulus data into C1.

Next, the tester outputs control to all scan cells to do an eighth capture (CP8) of the response output of the combinational logic (CL) to the PS8 stimulus. The tester then outputs control to cause all scan cells of circuits C1 through C3 to do an eighth 3-bit shift operation (SH8). The eighth 3-bit shift operation unloads the eighth captured 3-bit response data from C3, moves the eighth captured 3-bit response data from C1 to C2 and from C2 to C3, and inputs the first bit of the first 3-bit C2 stimulus pattern into C1's bypass memory (BM). Note that the serial input during SH8 is 1xx because the leading two bits (xx) will not be used, while the last bit (1) will be stored in C1's bypass memory and be the first bit of the first 3-bit stimulus pattern input to C2 during SH9. As previously mentioned in regard to FIG. 3, the bypass memory always loads the data from SI during shift operations and maintains its data during capture operations. This allows the present Disclosure to use bypass memories as data pipeline bits between the tester and circuit receiving stimulus input from the tester.

Following SH8, C1 is completely tested and the tester outputs control to cause C1's bypass memory to be selected between C1's SI and SO. Also the tester outputs control to cause C1's scan cells to hold (H) their present state for the remainder of the test. At this point, C1 only serves as a data pipeline bit between the tester and the scan path of C2. While C1's scan cells could continue to operate during the remaining tests, doing so would cause C1 to consume non-useful energy and produce heat. The advantage of holding a circuits scan path static to eliminate heat build up after the circuit has been tested will be discussed in more detail in regard to using the present Disclosure to accelerate wafer testing (FIGS. 26-29).

Next, the tester outputs control to all scan cells to do a ninth capture (CP9) of the response output of the combinational logic (CL) to the PS9 stimulus. The tester then outputs control to cause all scan cells of circuits C2 and C3 (C1 scan cells are disabled) to do a ninth 3-bit shift operation (SH9). The ninth 3-bit shift operation unloads the ninth captured 3-bit response data from C3, moves the ninth captured 3-bit response data from C2 to C3, and loads C2 with its first 3-bit stimulus pattern (001) from the tester (00) and C1 bypass bit (1). The loading of the 001 stimulus pattern into C2 during SH9 is seen in the dotted circle around the 00 tester input bits and dotted circle around the 1 bit in the C1 bypass memory. The last bit (0) of the 3-bit tester input (000) during SH9 is stored into C1's bypass memory and will be the first bit of the second 3-bit stimulus pattern (100) to C2 during SH10. The 001 stimulus to C2 during SH9 is a stimulus input pattern that is needed for testing C2 but did not occur in C1's output response during SH1-8. The other stimulus patterns that are needed for testing C2 but did not occur in the C1 response patterns are 100 and 111. These stimulus input patterns will be provided to C2 during the following SH10 (100) and SH11 (111) operations.

Next, the tester outputs control to all scan cells to do a tenth capture (CP 10) of the response output of the combinational logic (CL) to the PS10 stimulus. The tester then outputs control to cause all scan cells of circuits C2 and C3 to do a tenth 3-bit shift operation (SH10). The tenth 3-bit shift operation unloads the tenth captured 3-bit response data from C3, moves the tenth captured 3-bit response data from C2 to C3, and loads C2 with its second 3-bit stimulus pattern (100) from the tester (10) and C1 bypass bit (0). Again, the loading of the 100 stimulus pattern into C2 during SH10 is seen in the dotted circle around the 10 tester input bits and dotted circle around the 0 bit in the C1 bypass memory. The last bit (1) of the 3-bit tester input (110) during SH10 is stored into C1's bypass memory and will be the first bit of the third 3-bit stimulus pattern (111) to C2 during SH11.

Next, the tester outputs control to all scan cells to do an eleventh capture (CP11) of the response output of the combinational logic (CL) to the PS11 stimulus. The tester then outputs control to cause all scan cells of circuits C2 and C3 to do an eleventh 3-bit shift operation (SH11). The eleventh 3-bit shift operation unloads the eleventh captured 3-bit response data from C3 and moves the eleventh captured 3-bit response data from C2 to C3. Again, the loading of the 111 stimulus pattern into C2 during SH11 is seen in the dotted circle around the 11 tester input bits and dotted circle around the 1 bit in the C1 bypass memory. The last bit (x) of the 3-bit tester input (x11) during SH11 is stored into C1's bypass memory but will not be used for testing because C2's scan path, into which it will be shifted during SH12, will be bypassed following the SH12 operation.

Next, the tester outputs control to all scan cells to do a twelfth capture (CP12) of the response output of the combinational logic (CL) to the PS12 stimulus. The tester then outputs control to cause all scan cells of circuits C2 and C3 to do a twelfth 3-bit shift operation (SH12). The twelfth 3-bit shift operation unloads the twelfth captured 3-bit response data from C3 and moves the twelfth captured 3-bit response data from C2 to C3. Again, the loading of the 0xx stimulus pattern into C2's scan path during SH12 is indicated by the dotted circle around the 0x tester input bits and dotted circle around the x bit in the C1 bypass memory. As mentioned in the above paragraph the data (0xx) loaded into C2 scan path is not used because the scan path will be bypassed following SH12. However, the last two bits of the SH12 tester's 3-bit input (10x), will be loaded into the bypass memories of C1 (1) and C2 (0), and used as the first two bits of the last remaining 3-bit stimulus pattern input (010) for C3 during SH13.

Following SH12, C2 is completely tested and the tester outputs control to cause C2's bypass memory to be selected between C2's SI and SO. Also the tester outputs control to cause C2's scan cells to hold (H) their present state for the remainder of the test. At this point, C2 only serves as a data pipeline bit between the bypass bit of C1 and scan path of C3.

Next, the tester outputs control to all scan cells to do a thirteenth capture (CP13) of the response output of the combinational logic (CL) to the PS13 stimulus. The tester then outputs control to cause all scan cells of C3 to do a thirteenth 3-bit shift operation (SH13). The thirteenth 3-bit shift operation unloads the thirteenth captured 3-bit response data from C3 and moves the last remaining 3-bit stimulus input (010) from the tester and C1 and C2 bypass bits into C3's scan path. Again, the loading of the 010 stimulus pattern into C3's scan path during SH13 is seen by the dotted circle around the tester's 0 input bit and dotted circles around the 1 and 0 bits in the C1 and C2 bypass memories. Since this is the last required stimulus pattern from the tester, the tester inputs x bits following the 0 bit input during SH13.

Next, the tester outputs control to all scan cells to do a fourteenth capture (CP14) of the response output of the combinational logic (CL) to the PS14 stimulus. The tester then outputs control to cause all scan cells of C3 to do a fourteenth 3-bit shift operation (SH14) to unload the last response output from C3. Following SH14, the test of C3 is complete.

The number of test clocks required to test circuits C1, C2, and C3 using the warping scan test concept is the sum of the capture clocks (CP1-14) and the shift clocks (SH1-14), or 14+(14×3)=56 clocks. This compares with 80 clocks used to test the same circuits using the conventional scan test approach in example 1.

During the testing of C1, C2 was provided with its 000, 010, 011, 110, and 101 stimulus inputs from C1 response, i.e. C2 received 5 of its 8 stimulus inputs while C1 was being tested. Also during testing of C1, C3 was provided with its 000, 001, 011, 100, 111, and 110 stimulus inputs from C2 response, i.e. C3 received 6 of its 8 stimulus inputs while C1 was being tested. Note that C3's 001 stimulus input at PS2 was generated by C2 as a response to C2's initial 000 (reset) stimulus input at PS1, so C3's 001 stimulus was generated independently of any stimulus scanned in from the tester. Similarly, C3's 011 stimulus at PS3 originated as C1's response to its 000 (reset) stimulus at PS1, so C3's 011 stimulus was also independent of any stimulus scanned in from the tester. After C1 was bypassed, C2 received its remaining 001, 100, and 111 stimulus inputs from the tester. During the testing of C2, C3 was provided with its 101 stimulus input from C2 response, i.e. C3 received 1 of its 2 remaining stimulus inputs while C2 was being tested. After C2 was bypassed, C3 received its remaining 010 stimulus input. From this it is seen that C2 was 62.5% tested (5 of 8) and C3 was 75% tested (6 of 8) after C1 was tested. Also, it is seen that C3 was 87.5% tested (7 of 8) after C2 was tested.

Although the tester obviously does not receive all response bits from all circuits, it does receive a bit stream that is (1) uniquely predictable based on the circuits under test and the scan path structure, and (2) representative of all responses from all of the circuits under test. Similarly the tester does not provide all stimulus bits to all circuits, but the stimulus needed from the tester is readily determined based on the circuits under test and the scan path structure.

A diagram showing the contents of the scan path at key times during the test, for example the diagram shown in Example 2, is readily generated as follows. First, all the bit data from PS1 through CP8 is generated by starting with all scanned cells cleared to 0 at PS1, and then filling in the remaining bits based on the C1, C2 and C3 tables and the seven stimulus patterns which must be shifted in at SH1-SH7 to complete the testing of C1. The final response pattern from C1 is captured at CP8.

It is next determined which C2 stimulus patterns still need to be shifted in from the tester to complete the testing of C2. This is done by simply inspecting the bit patterns at PS1-PS8 of the C2 column and at CP8 of the C1 column, and then comparing the inspected bit patterns to the known required set of C2 stimulus patterns. Any C2 stimulus patterns missing from the inspected patterns must be shifted in to C2 from the tester. Next, all bit data from SH8 through CP12 is filled in based on (1) the C2 and C3 tables, (2) the remaining C2 stimulus patterns to be shifted in from the tester, and (3) the fact that the remaining C2 stimulus patterns will be shifted from the tester to C2 via the C1 bypass bit. The final response pattern from C2 is captured at CP12.

It is next determined which C3 stimulus patterns still need to be shifted in from the tester to complete the testing of C3. This is done by simply inspecting the bit patterns at PS1-PS12 of the C3 column and at CP12 of the C2 column, and then comparing the inspected bit patterns to the known required set of C3 stimulus patterns. Any C3 stimulus patterns missing from the inspected bit patterns must be shifted in to C3 from the tester. Next, all bit data from SH12 through CP14 is filled in based on (1) the C3 table, (2) the remaining C3 stimulus pattern, and (3) the fact that the remaining C3 stimulus pattern will be shifted from the tester to C3 via the C1 and C2 bypass bits. The final response pattern from C3 is captured at CP14.

Once the scan path contents diagram has been completed using the above-described procedure, both the stimulus bit stream required to be output from the tester and the response bit stream expected to be received at the tester are easily determined by inspection of the completed diagram. In particular, the stimulus bit stream required from the tester is shown in the SI column of the completed diagram, and the response bit stream expected to be received at the tester is shown in the SO column of the completed diagram.

The scan path contents diagram for any desired set of circuits under test can actually be completed manually using pencil and paper and following the above-described procedure. Of course, a computer program can be readily written to complete the diagram in automated fashion.

In Example 2, the response from C1 reduced the need of stimulus in C2 and C3. Also, the bypass concept works to allow circuits downstream of circuits already tested to receive stimulus data from the tester through a pipelined data path that maintains the stimulus data from the tester during capture operations. While the Disclosure can work by shifting data through the scan paths of circuits previously tested, instead of using the bypass memory, the scan path length between the tester and downstream circuits being tested grows in length since following each capture operation, the tester must shift data through all leading tested circuits to input data to circuits being tested. Further, the use of the bypass feature allows the scan paths of circuits tested to be held static while testing is progressing in downstream circuits. Holding scan paths static eliminates power consumption within tested circuits, except for the bypass scan path, and thereby eliminates heat build up in circuits previously tested. Eliminating heat build up in circuits is important, especially at wafer level testing using the warping scan test concept as will be described in regard to FIGS. 26-29.

A Further advantage to the bypassing feature is that it allows the tester to directly, via intermediate bypass memories, apply all remaining stimulus patterns to the circuit being tested downstream. If the scan paths of previously tested circuits were to remain in the scan path between the tester and circuit being tested, there is the possibility that the circuit being tested may not be able to receive all of its remaining stimulus patterns. This is because the scan paths between the tester and circuit being tested may not be able to produce the required stimulus patterns by the capture and shift process. Simply put, the intermediate scan paths between the tester and circuit being tested may not have a response pattern to any stimulus pattern applied that will produce the required remaining stimulus pattern(s) for the circuit being tested.

Figure 1:
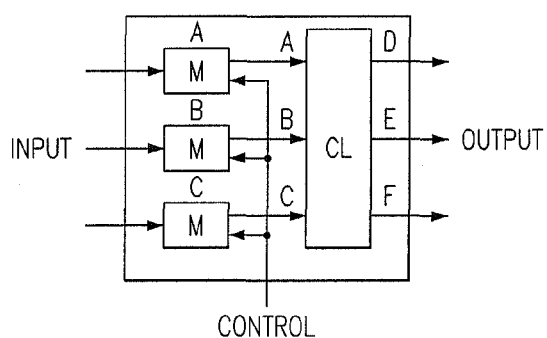
FIG. 1 is a block diagram of a known electrical circuit having three memories.
Figure 2:
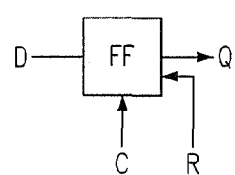
FIG. 2 is a block diagram of one memory part of FIG. 1.
Figure 3:
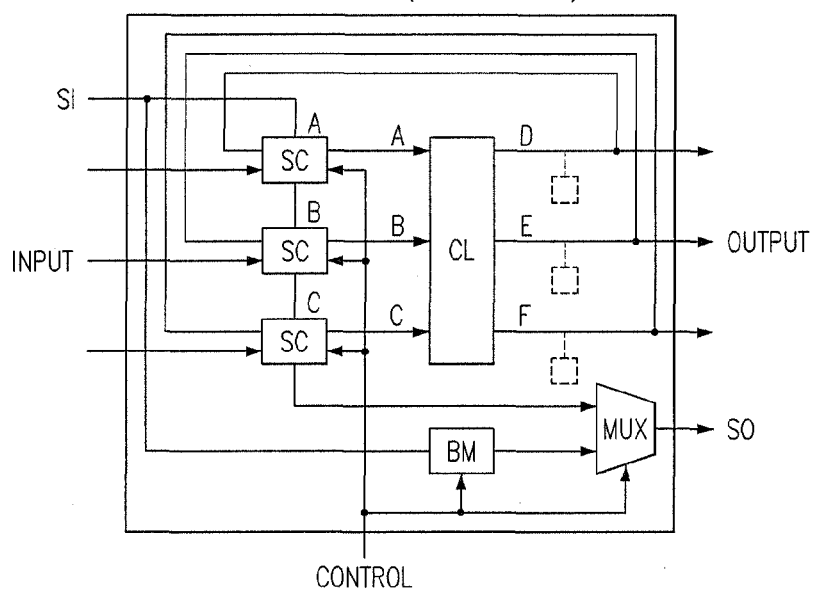
FIG. 3 is a block diagram of a circuit having a 3-bit scan path.
Figure 9:
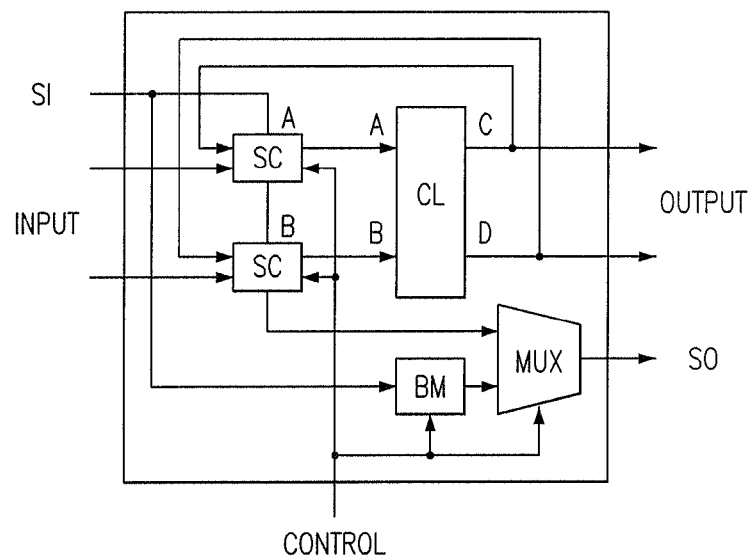
FIG. 9 is a block diagram of a circuit similar to that in FIG. 3 with only a 2-bit scan path.

FIG. 9 shows a circuit similar to the FIG. 3 circuit except that it only has a 2-bit scan path. The circuit of FIG. 9 will be used in Examples 3 and 4 to illustrate the operation of the present Disclosure with circuits having unequal scan path lengths.

Figure 5:
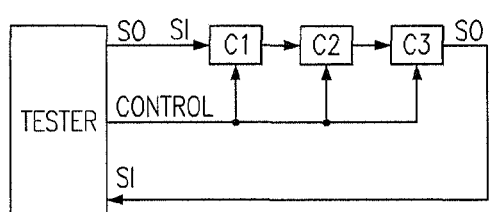
FIG. 5 is a block diagram of three circuits of FIG. 3 connected in series to a tester.

Example 3 illustrates three circuits C1, C2, and C3, again connected to a tester as shown in FIG. 5. C1 has a 2-bit scan path, C2 has a 3-bit scan path, and C3 has a 2-bit scan path. The tables for C1, C2, and C3 show the stimulus and response reaction of each circuit's combinational logic during scan testing. At the beginning of the test, the tester outputs control to reset all circuit scan paths to a first initial present state as previously described in Example 2. Then the tester does four capture and 2-bit shift operations (CP1-4 & SH1-4) to test C1 as previously described in Example 2. At the end of SH4, C2 has been tested against 4 of its 8 3-bit stimulus patterns (000,010,100,111), and C3 has been tested against 3 of its 4 2-bit stimulus patterns (00,01,11).

After the fourth shift operation (SH4), C1 is completely tested and is bypassed as previously described in Example 2. Also after SH4, the tester adjusts from 2-bit shift operations to 3-bit shift operations to test C2 since it has a 3-bit scan path. To complete the testing of C2, the tester does four capture and 3-bit shift operations (CP5-8 & SH5-8). CP5 and SH5 test C2 and C3 against previously tested 000 and 00 stimulus pattern, respectively, left in C2's and C3's scan path at the end of SH4. SH5 also loads into C2's 3-bit scan path the first of the remaining four C2 stimulus patterns (001), whose response is captured at CP6. CP7-9 and SH6-9 test C2 against the remaining three C2 stimulus patterns (011,101,110). During CP8 and SH8, C3 is tested against its remaining 2-bit stimulus pattern (10) by output response from C2 during CP7 and SH7, so C3 is completely tested by the testing of C1 and C2. CP9 loads the last response from C2 to its last remaining stimulus pattern (110). Since C3 has been tested, the tester does not need to bypass C2. Subsequently, during SH9, the tester adjusts the scan operation to a length of 5 bits so that the final response from C2 can be shifted out during the SH9 operation. It is important to note here that the 2-bit contents of C3's scan path is important during the SH9 operation, since it contains the response residue of C2 to the 101 stimulus pattern captured and shifted out of C2 during the CP8 and SH8 operations.

During the first four capture and 2-bit shift operations, the 3-bit scan path of C2 is only partially filled from C1 (2-bits) and only partially emptied to C3 (2-bits). This means that one bit of C2's 3-bit response pattern from a previous capture and shift operation will remain in C2's scan path and be reused itself as part of the stimulus pattern for the next capture and shift operation of C2. The other two bits used for C2's next 3-bit stimulus pattern will be provided by the shifted in 2-bit response output from C1.

In general, a leading circuit with a shorter scan path will amplify the number of stimulus patterns input to a following circuit with a longer scan path. This is because the frequency of capture and shift operations to both circuits is determined by the time it takes to shift data in and out of the leading shorter scan path. For example, at the beginning of the Example 3 test, the frequency of the capture and shift operations to all circuits is set by the first four (SH1-4) 2-bit shift operations that load stimulus patterns from the tester into C1. This same capture and shift frequency for the first four 2-bit shift operations is used to load stimulus patterns from C1 into C2, and from C2 into C3. So, C2 actually receives its first four stimulus patterns, which would take four 3-bit shift operations using conventional scan testing, in only four 2-bit shift operations using the warping scan test concept. For the first four shift operations, the input stimulus pattern to C2 comprises two bits of response from C1 plus one bit of retained response from C2. This is seen for example in the creation of C2's third present state (PS3) stimulus pattern 100. PS3 100 is created by CP2 loading the scan paths of C1 and C2 with 10 and 011, respectively, then shifting the scan paths twice during SH2 to obtain 100 in C2's scan path.

The number of test clocks required to test circuits C1, C2, and C3 using the warping scan test concept shown in Example 3 is 34. Testing the circuits of Example 3 using conventional scan testing, as described in Example 1, would require 64 test clocks.

Example 4 illustrates three circuits C1, C2, and C3, again connected to a tester as shown in FIG. 5. C1 has a 3-bit scan path, and C2 and C3 both have 2-bit scan paths. The tables for C1, C2, and C3 show the stimulus and response reaction of each circuit's combinational logic during scan testing. At the beginning of the test, the tester outputs control to reset all circuit scan paths to a first initial present state as previously described in Example 2. Then the tester does seven capture and 3-bit shift operations (CP1-7 & SH1-78) and one capture and 7-bit shift operation (CP8 & SH8) to test C1 as previously described in Example 2. During the testing of C1, C2 and C3 receive all their required stimulus patterns by response output from C1. So when C1 is tested, so are C2 and C3. Since C2 and C3 are tested during C1's tests, no bypassing steps are required. Following CP8, a seven bit shift operation is performed during SH8 to allow the tester to unload all response residue from the scan paths of C1, C2, and C3 to complete the test.

The number of test clocks required to test circuits C1, C2, and C3 using the warping scan test concept shown in Example 4 is 36, as opposed to 64 test clocks using conventional scan testing as described in Example 1.

Figure 10:
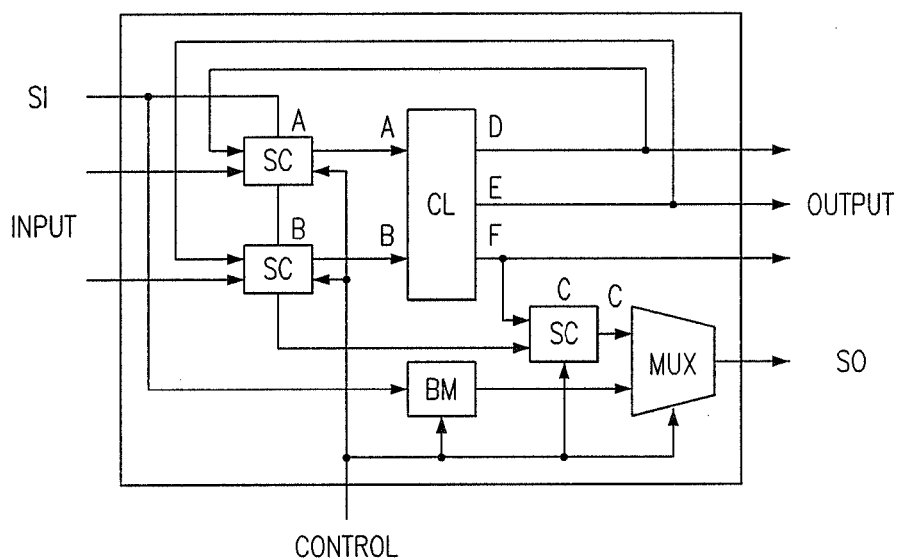
FIG. 10 is a block diagram of a circuit similar to that in FIG. 3 with a greater number of outputs than inputs.
Figure 11:
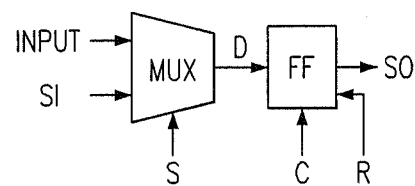
FIG. 11 is a block diagram of a scan cell C of FIG. 10.

FIG. 10 shows a circuit similar to the previously described FIG. 3 circuit, except that it has an greater number of outputs (3) than inputs (2). Since the number of outputs is greater than the number of inputs, a scan cell is added to the extra output so that its response can be captured and shifted out during scan testing. The structure of the scan cell (C) added and connected to the F output of the combinational logic is prior art and shown in FIG. 11. During conventional scan testing, scan cell C serves to capture the F output and shift the data out. It is important to note that in conventional scan testing of the FIG. 10 circuit, the data shifted into the scan cell (C) is don't care data since the data does not provide stimulus input to the combinational logic.

Figure 12:
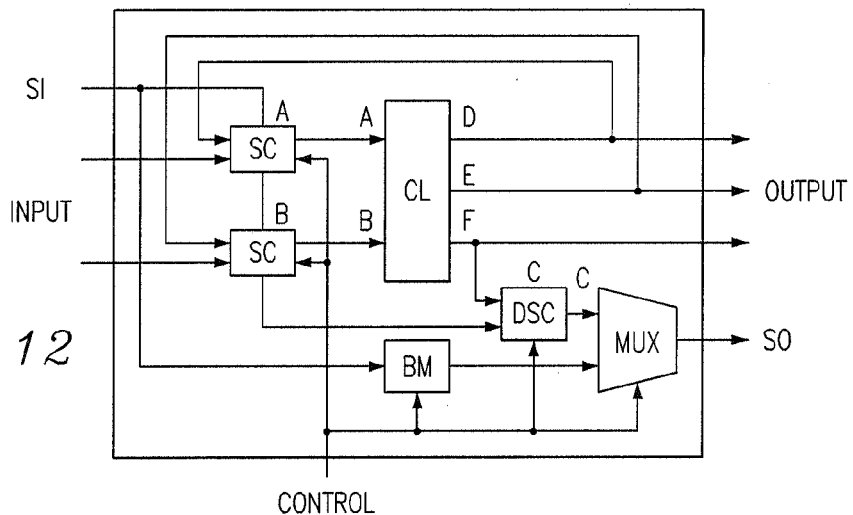
FIG. 12 is a block diagram of the circuit of FIG. 10 modified to accept the warping scan test concept.
Figure 13:
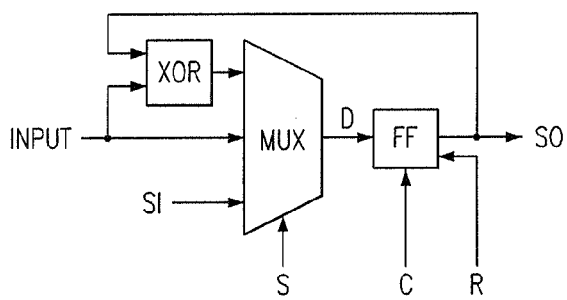
FIG. 13 is a block diagram of a summing cell (DSC).

FIG. 12 shows how the FIG. 10 circuit is modified to support the warping scan test concept. The modification is to replace the prior art scan cell (C) connected to F with a data summing cell (DSC) as shown in FIG. 13. The warping scan test concept requires that scan cells that are added solely for the purpose of capturing response data, as shown in scan cell C of FIG. 12, be loaded during capture operations with the sum of their present state data and the data they are capturing. This way, response data shifted into the scan cell is not lost during the capture operation.

In FIG. 13, the data summing cell includes a 3 input multiplexer, an XOR gate, and a FF. The multiplexer is controlled by a select signal (S) to allow either the output of the XOR, the normal capture input (Input), or the serial input (SI) to be coupled to the FF. During conventional scan testing, the multiplexer couples the Input to the FF during capture operations, and the SI to the FF during shift operations, just like the FIG. 11 scan cell. During warping scan tests, the multiplexer couples the XOR output to the FF during capture, instead of the conventional Input. The output of the XOR represents the sum of the Input data and the present state data of the FF. The reason for summing the Input data with the FF's present state data is that the FF will potentially contain response data shifted in from a previous circuit, which is not used in FIG. 12 as stimulus. The response data bit in the FF cannot be lost by the capture operation, as is done in the conventional scan cell of FIG. 11. If the response data were lost (overwritten) by the capture operation, that response data bit or its effect as stimulus to downstream circuits would not be seen by the tester. So, to allow the response data in the FF to be maintained during the capture operation, it is summed with the Input data, and that sum data is stored into the FF during capture. Since the FF data is not lost, it meets the requirement mentioned above for the warping scan test concept.

Example 5 shows two circuits C1 and C2 being tested using the warping scan test concept. C1 is a circuit as shown in FIG. 3 with a 3-bit scan path. C2 is a circuit as shown in FIG. 12 with a data summing cell (DSC) coupled to the F output of the combinational logic. The present state and next state table of C1 is shown as previously described. The present state and next state table for C2 indicates the summing of the F output of the combinational logic and the present state of scan cell C (the DSC). In looking at FIG. 12 it is seen that the combinational logic only responds to stimulus from scan cells A and B. In looking at the C2 table, it is seen that; (1) for a PS ABC of 00x, the DEF outputs are 010, (2) for a PS ABC of 01x, the DEF outputs are 100, (3) for a PS ABC of 10x, the DEF outputs are 110, and (4) for a PS ABC of 11x, the DEF outputs are 000. Again looking at the C2 table it is seen that; when F=0 and the PS C=0, the NS C=0, and when F=0 and the PS C=1, the NS C=1. This shows the XOR'ing of output F with PS data in scan cell C.

The warping scan test of C1 and C2 in Example 5 proceeds as previously described. What is important about Example 5 is to see the that the response data from C1 shifted into scan cell C of C2 is not lost during the capture operations. During each capture operation the response data from C1 in scan cell C is summed with the response output F from C2's combinational logic and that summed signal is shifted out to the tester for inspection. This way if C1 or C2 had a faulty response bit, it would be detectable by the tester. It is possible for a double fault to occur in C1 and in C2 such that the sum of the two faults appear to be a correct response. For example if a good response of 1 from C1 were summed with a good response of 0 from C2, the result would be an output to the tester of a 1. If a bad response of 0 from C1 occurred coincidental with a bad response of 1 from C2, the result would also be an output to the tester of a 1. This is called aliasing and it is known to those skilled in the art of testing, especially testing using signature analysis methods. The likelihood of aliasing is rare, but it can happen.

Figure 14:
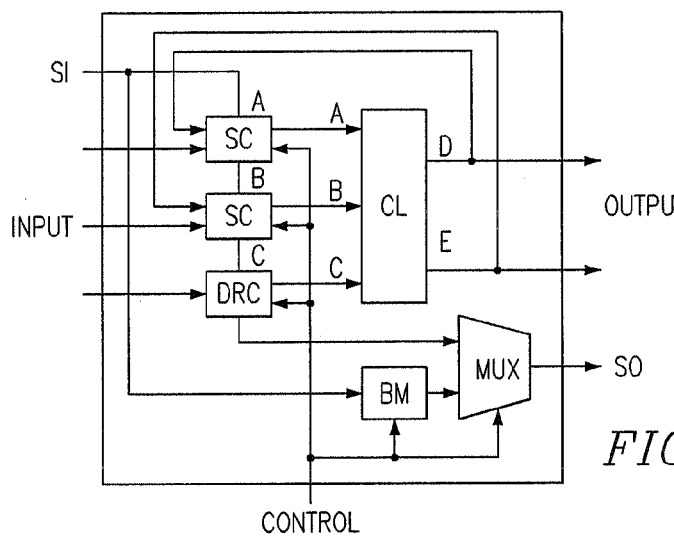
FIG. 14 is a block diagram of a scan testable circuit.

FIG. 14 shows a scan testable circuit with 3 inputs and 2 outputs. Outputs D and E are fed back to scan cells A and B, respectively. Scan cells A and B provide stimulus to the circuit's combinational logic and capture response from the combinational logic. Scan cell C only provides stimulus to the circuit's combinational logic. It is advantageous for scan cell C to retain the data shifted into it during capture operations. If the data is retained, it can be output to the tester or reused as stimulus data in downstream circuits. It is common for conventional scan cells to capture data from the circuit's input into scan cell C of FIG. 14, which may be unknown data. A preferred scan cell called a data retaining cell (DRC) is shown in FIG. 14 and shown schematically in FIG. 15. The data retaining cell simply captures the present data state of the FF during capture operations, which allows the data to be supplied to the tester or reused as stimulus data in downstream circuits.

Figure 15:
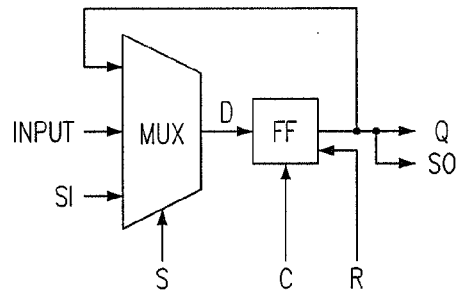
FIG. 15 is a block diagram of a data retaining cell (DRC).

Example 6 simply shows a circuit C1 like FIG. 3 and a circuit C2 like FIG. 14 having a data retaining scan cell C as shown in FIG. 15. The circuits are tested using the warping scan test concept as previously described. What is important to see in Example 6 is that the C1 response data shifted into scan cell C of C2 is retained during the capture operation to be shifted out to the tester. By retaining the data in scan cell C, the tester has the ability to better diagnose failures. For example if a failing response was output from C2, that failure may be caused by either; (1) bad combinational logic of C2, (2) incorrect stimulus input from C1 to scan cell C of C2, or (3) both a bad combinational logic in C2 and a bad input stimulus from C1 to scan cell C of C2. If the data in scan cell C is retained, then the tester can diagnose this situation to determine what was bad.

Example 7 shows the ideal case for the warping scan test concept. In Example 7, N circuits as shown in FIG. 3 are connected in series on a scan path operated from a tester as shown in FIG. 5. Every leading circuit in this ideal case produces response output that meets the stimulus input need of a trailing circuit. In this example, all circuits are identical as seen in the present state and next state table. However, they need not be identical, but rather, for the ideal case, they need to meet the statement above, which restated says that "a leading circuit must produce output response that meets the stimulus need of a trailing circuit". A leading circuit may produce more output response than is needed for stimulus in a trailing circuit and still meet the above criterion, but it cannot produce less. Also, leading and trailing circuits may have scan path length differences and still meet the above statement.

In Example 7 it is seen that by the time the first C1 is tested, all trailing C1s have been tested. The last shift operation (SH8) is used to unload all C1 scan path response residue to the tester. This is a remarkable reduction in test time, especially for IC and system manufacturers, since N circuits could be tested in the time it take to test one circuit, plus the time it takes to shift out the response residue from the N circuits. The N circuits could be die, wafers, ICs, boards, etc. Examples of different ways the warping scan test concept could be employed to reduce test time is described later in regard to FIG. 22-29.

While Example 7 shows the circuits as having 3-bit scan path length and a stimulus pattern requirement of eight, the circuits could have any scan path length or any stimulus pattern count. If the circuits are identical, and their scan path lengths are L, their stimulus pattern count is P, and the capture step is C, an equation for the number of test clocks required to test N identical circuits using the warping scan concept is $P(C+L)+NL-L$, where $P(C+L)$ is the test clocks required to test the first circuit (and the other N−1 circuits), and $NL-L$ is the test clocks required to unload the scan paths of the remaining N−1 circuits. In comparison, an equation for the number of test clocks required to test N identical circuits using the conventional scan approach is $P(C+NL)$. For large L and P, the equations simplify to: Warping Scan Test Clocks=$L(P+(N-1))$ and Conventional Scan Test Clocks=$LPN$.

Case 1: For L=2000, P=1000, N=1

Warping Scan Test Clocks=$L(P+(N-1))$=2000(1000+(1-1))=2,000,000

Conventional Scan Test Clocks=$LPN$=2000×1000×1=2,000,000

Case 2: For L=2000, P=1000, N=100

Warping Scan Test Clocks=$L(P+(N-1))$=2000(1000+(100-1))=2,198,000

Conventional Scan Test Clocks=$LPN$=2000×1000×100=200,000,000

Case 3: For L=2000, P=1000, N=1000

Warping Scan Test Clocks=$L(P+(N-1))$=2000(1000+(1000-1))=3,998,000

Conventional Scan Test Clocks=$LPN$=2000×1000×1000=2,000,000,000

For a test clock frequency of 10 megahertz (period=100 nanoseconds), Case 1 warping scan test time and conventional scan test is 200 milliseconds. Case 2 warping scan test time is 219.8 milliseconds, and conventional scan test time is 20 seconds. Case 3 warping scan test time is 399.8 milliseconds, and conventional scan test time is 200 seconds.

For non-ideal circuits 1-N where the response output from a tested leading circuit only reduces the stimulus need of all trailing circuits by a % reduction factor (R), the test clocks required by the warping scan test concept can be approximated by;

Test Clocks=$P_1(C+L_1)+RP_2(C+L_2)+RP_3(C+L_3) \ldots RP_N(C+L_N)$

For large $P_{1-N}$ and $L_{1-N}$, the equation simplifies to;

Test Clocks=$P_1L_1+RP_2L_2+RP_3L_3 \ldots RP_NL_N$

If the % reduction factor (R) is constant for each circuit, for example at the end of each leading circuit test, the need for additional stimulus in all trailing circuits is reduced by an R of 50%, then;

Test clocks=$P_1L_1+\frac{1}{2}(P_2L_2)+\frac{1}{4}(P_3L_3))-+\frac{1}{8}(P_3L_3)) \ldots \frac{1}{2}^N(P_NL_N)$ If all circuits have the same P and L, then;

Test Clocks=$P_{1-N}L_{1-N}(1+\frac{1}{2}+\frac{1}{4}+\frac{1}{8}+ \ldots \frac{1}{2}_{N-1})$ Case 4: For L=2000, P=1000, N=2

Warping Scan Test Clocks=$PL(1+\frac{1}{2})$=3,000,000

Conventional Scan Test Clocks=$PL(2)$=4,000,000

Case 5: For L=2000, P=1000, N=5

Warping Scan Test Clocks=$PL(1+\frac{1}{2}+\frac{1}{4}+\frac{1}{8}+\{fraction (\frac{1}{16})\})$=3,875,000

Conventional Scan Test Clocks=$LP(5)$=2000×1000×5=10,000,-000

Case 6: For L=2000, P=1000, N=100

Warping Scan Test Clocks=$PL(1+\frac{1}{2}+\frac{1}{4}+\frac{1}{8}+ \ldots \frac{1}{2}^{100})$=<4,000,000

Conventional Scan Test Clocks=$LP(5)$=2000×1000×100=200,0-00,000

Case 7: For L=2000, P=1000, N=1000

Warping Scan Test Clocks=$PL(1+\frac{1}{2}+\frac{1}{4}+\frac{1}{8}+ \ldots \frac{1}{2}^{1000})$=<4,000,000

Conventional Scan Test Clocks=$LP(5)$=2000×1000×1000=2,00-0,000,000

In comparing Case 2 with Case 6 (N=100) and Case 3 with Case 7 (N=1000), it is seen that there is little difference in the number of test clocks between the ideal and non-ideal warping scan test cases, as long as the % reduction factor R is maintained at 50% in the non-ideal cases.

Figure 16:
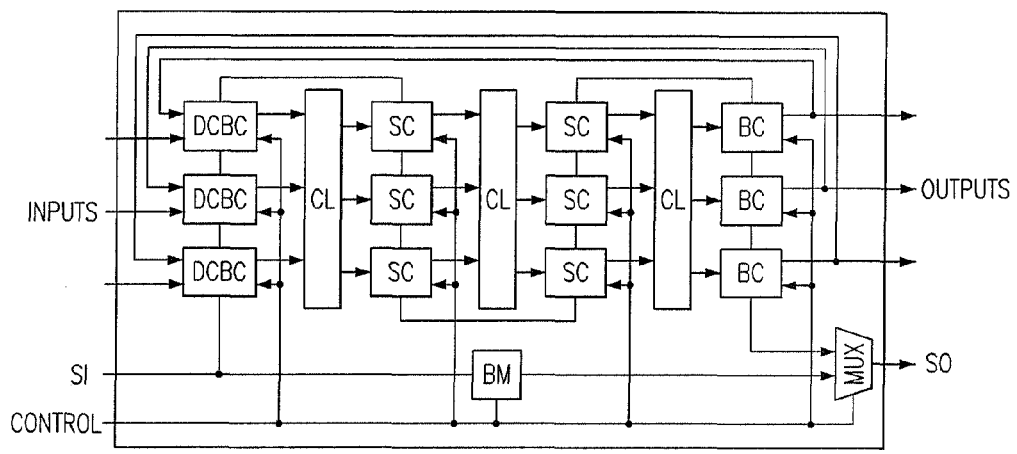
FIG. 16 is a block diagram of an implementation of a warping scan test concept.
Figure 17:
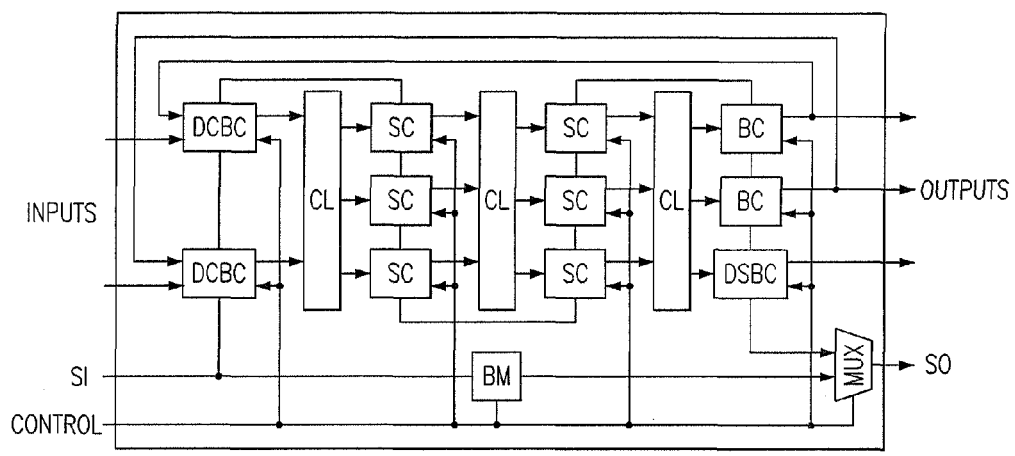
FIG. 17 is a block diagram of another implementation of a warping scan test concept.
Figure 18:
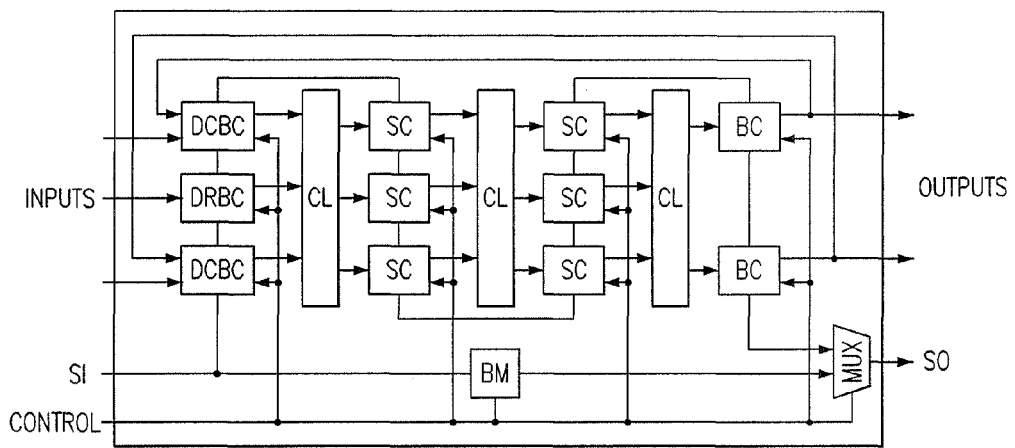
FIG. 18 is a block diagram of another implementation of a warping scan test concept.

FIGS. 16 through 18 illustrate an example of how the warping scan test concept could be implemented on circuits that have scannable boundary cells (BC) at the primary inputs and outputs (boundary) of the circuits. Boundary scan cells are well known in the art of testing. FIG. 16 relates to the previously described FIG. 3. FIG. 17 relates to the previously described FIG. 12. FIG. 18 relates to the previously described FIG. 14.

Using the warping scan test concept with boundary cells requires different boundary cell designs than the conventional boundary cell designs used today. The data capture boundary cells (DCBC) of FIGS. 16, 17, and 18 relate to the previously described data capture cell of FIGS. 3 and 4A. The data summing boundary cell (DSBC) of FIG. 17 relates to the previously described data summing cell DSC of FIGS. 12 and 13. The data retaining boundary cell (DRBC) of FIG. 18 relates to the previously described data retaining cell DRC of FIGS. 14 and 15.

Figure 19:
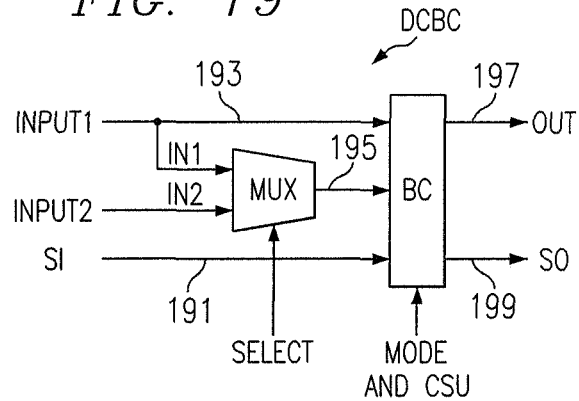
FIG. 19 is a block diagram of a data capture boundary cell (DCBC).
Figure 20:
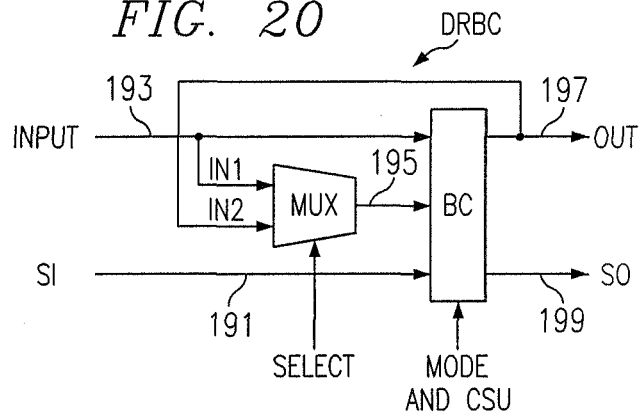
FIG. 20 is a block diagram of a data retaining boundary cell (DRBC).
Figure 21:
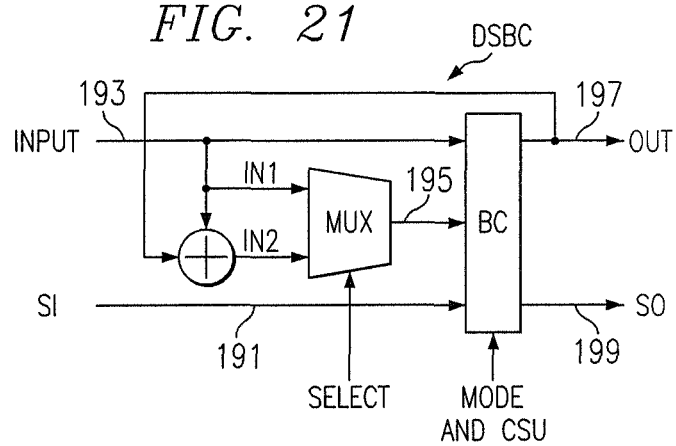
FIG. 21 is a block diagram of a data summing boundary cell (DSBC).
Figure 21A:
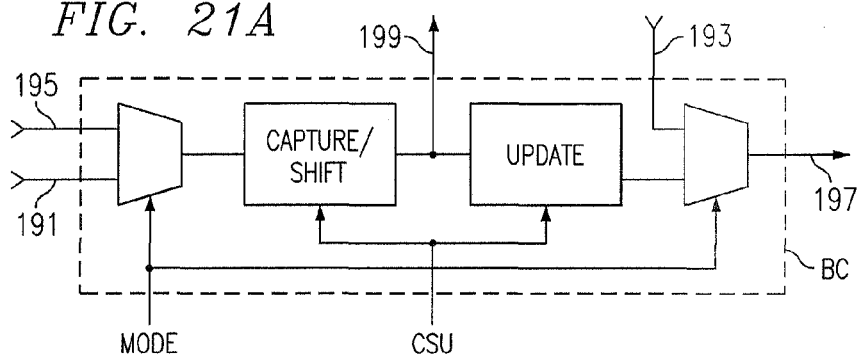
FIG. 21A is a block diagram of a realization of DCBC, DRBC, and DSBC.

Example designs for DCBC and DRBC are respectively shown in FIGS. 19 and 20. An example design for DSBC is shown in FIG. 21. FIG. 21A shows how DCBC, DRBC and DSBC are realized. Nodes 191, 193, 195, 197 and 199 are connected as shown. The BC structure enclosed in broken line is conventional, but the illustrated node connections to realize DCBC, DRBC and DSBC represent part of the present Disclosure.

Figure 22:
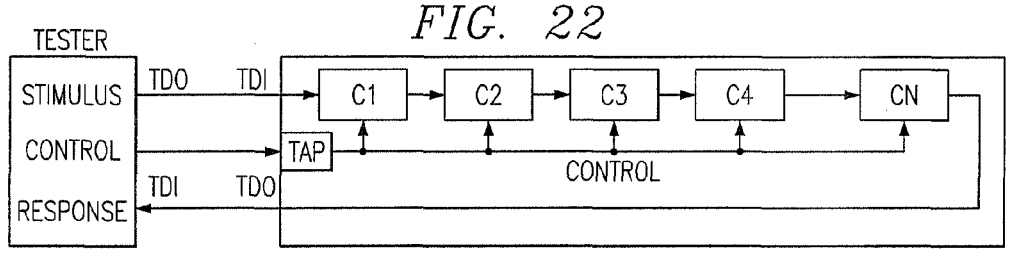
FIG. 22 is a block diagram of circuits C1-CN being tested inside an IC or die.

FIG. 22 illustrates how the warping scan test concept could be used to test multiple circuits C1-CN inside an IC or Die. Each circuit 1-N in FIG. 22 could be similar to circuits previously described in regard to FIGS. 3, 12, 14, and 16-18. Also shown in FIG. 22 is the fact that the circuits may receive control during the warping scan test from a conventional IEEE 1149.1 standard Test Access Port (TAP) which is connected externally of the IC/Die to a tester. Alternately, the IC/Die could receive control directly from the tester, or via a test port different from the IEEE 1149.1 TAP.

Figure 23:
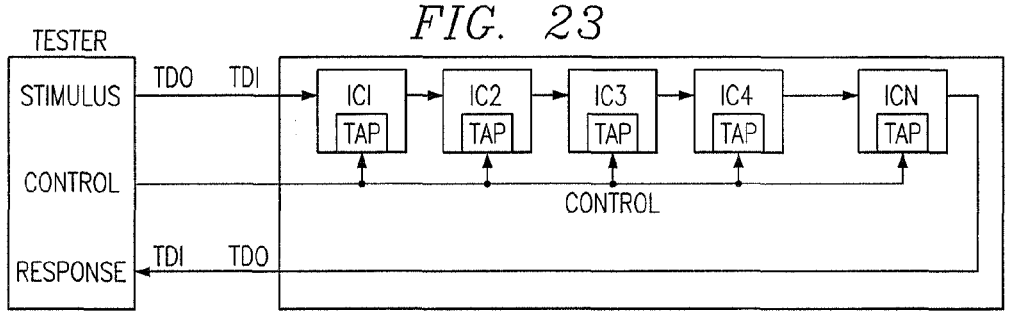
FIG. 23 is a block diagram of ICs 1-N being tested on a circuit board.

FIG. 23 illustrates how the warping scan test concept could be used to test multiple ICs 1-N on a board, or similarly, multiple Die 1-N on a multi-chip module (MCM) substrate. Each IC/Die 1-N in FIG. 23 could be similar to the IC/Die described previously in regard to FIG. 22. Each IC/Die of the board/MCM is shown interfaced to an external tester connected to the board/MCM.

Figure 24:
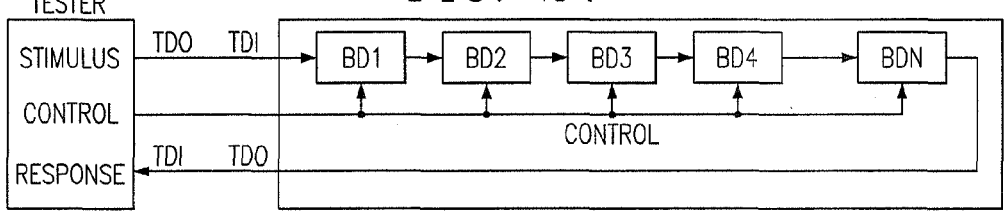
FIG. 24 is a block diagram of boards BD being tested in a box.

FIG. 24 illustrates how the warping scan test concept could be used to test multiple boards (BD) in a box. Each board 1-N in FIG. 24 could be similar to the board described previously in regard to FIG. 23. Each board of the box is shown interfaced to an external tester connected to the box/board.

Figure 25:
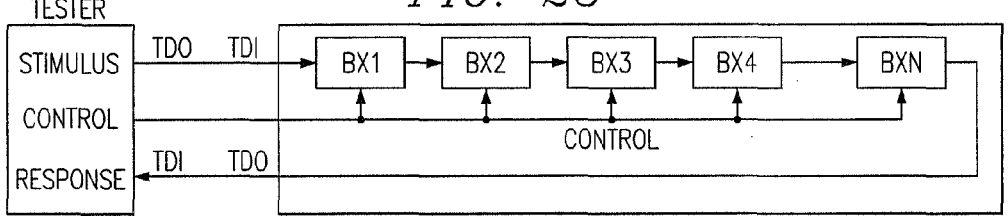
FIG. 25 is a block diagram of multiple boxes 1-N being tested in a system.

FIG. 25 illustrates how the warping scan test concept could be used to test multiple boxes (BX) 1-N in a system. Each box 1-N in FIG. 25 could be similar to the box described previously in regard to FIG. 24. Each box of the system is shown interfaced to an external tester connected to the system.

Figure 26:
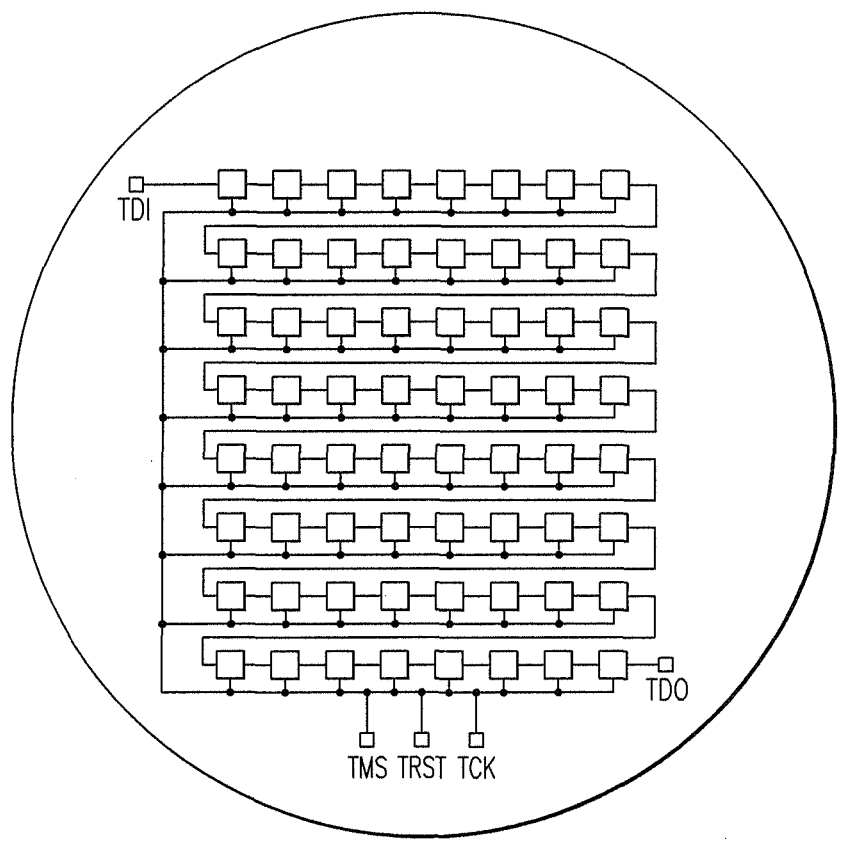
FIG. 26 is a representation of dies being tested on a wafer.
Figure 27:
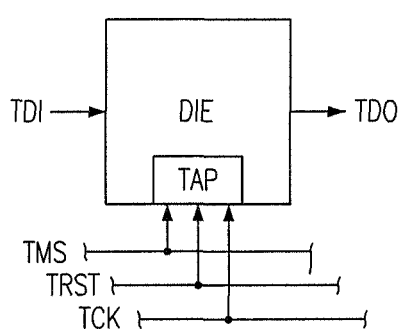
FIG. 27 is a block diagram of a test access port on a die.

FIG. 26 illustrates how the warping scan test concept could be used to test die on a wafer. Each die could be similar to the die described previously in regard to FIG. 22. As seen in FIG. 27, each die on the wafer has an IEEE 1149.1 test data input (TDI), test data output (TDO), test clock (TCK), test mode select (TMS), and a test reset (TRST) pad connection. Also as shown in FIG. 26, all die are connected in series, via their TDI and TDO pads, between the wafer's TDI input and TDO output. Further, all die TMS, TCK, and TRST pads are connected in parallel to the wafer's TMS, TCK, and TRST inputs. By applying power to the wafer and executing the warping scan tests on all die by probing the wafer's TDI, TDO, TCK, TMS, and TRST wafer test points with a tester, extremely fast testing of all die on the wafer can be achieved. Also, since the warping scan test bypasses tested circuits and holds their scan paths static, very little heat is generated on the wafer during warp testing. For example, at the beginning of a warp scan test, the scan path of all die are active and start to generate heat. When the first die is tested it freezes its scan path and begins to cool. Similarly other circuits will freeze their scan paths and begin to cool after they have been tested. Also the speed of the warp scan test will prevent the circuits from being active for a long enough time to generate damaging heat.

Figure 28:
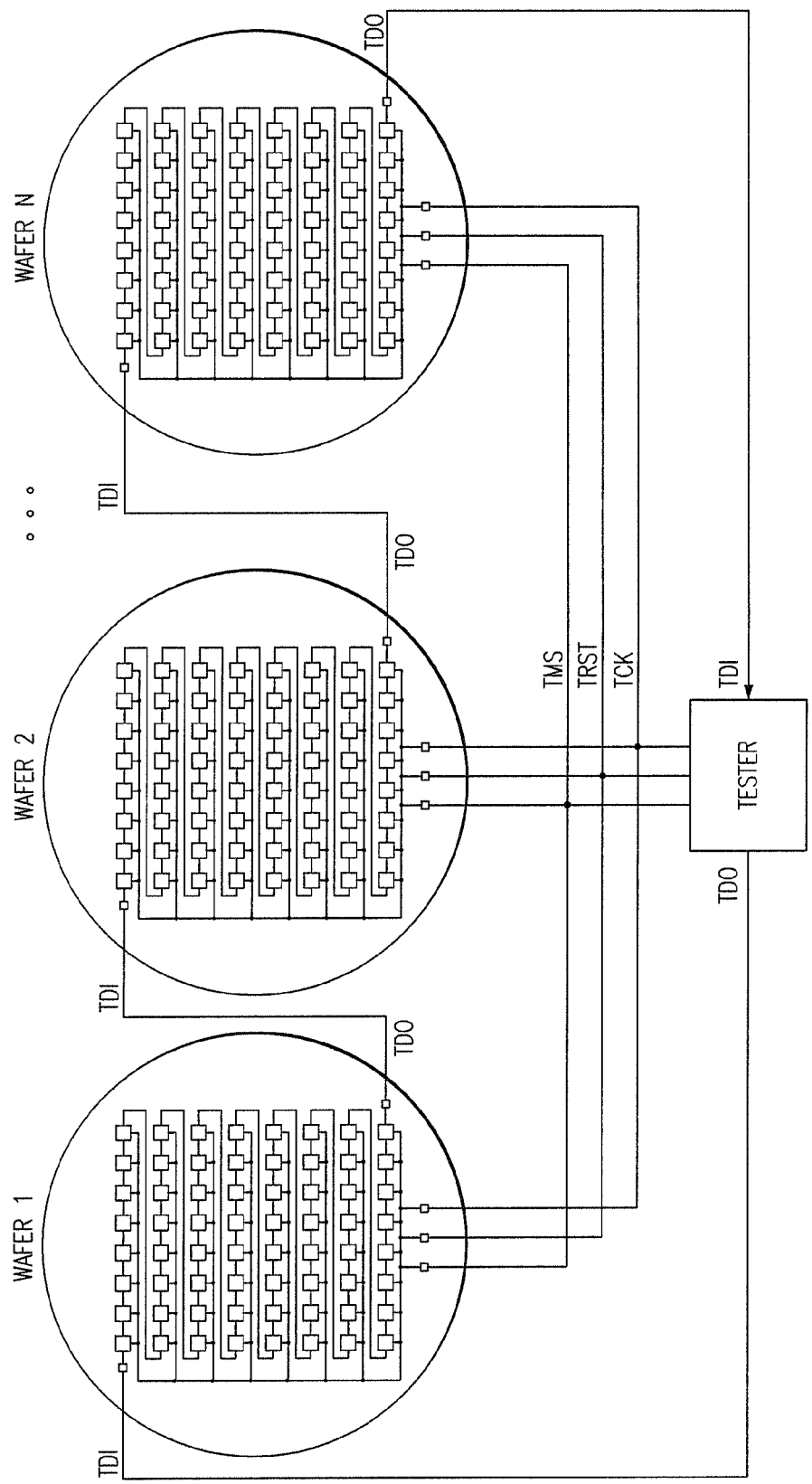
FIG. 28 is a representation of wafers, each carrying dies, being tested in a lot.

FIG. 28 illustrates how the warping scan test concept could be used to test multiple wafers in a lot. Each wafer 1-N in FIG. 28 could be similar to the wafer described previously in regard to FIGS. 26 and 27. Each wafer in the lot is shown interfaced to an external tester.

Figure 29:
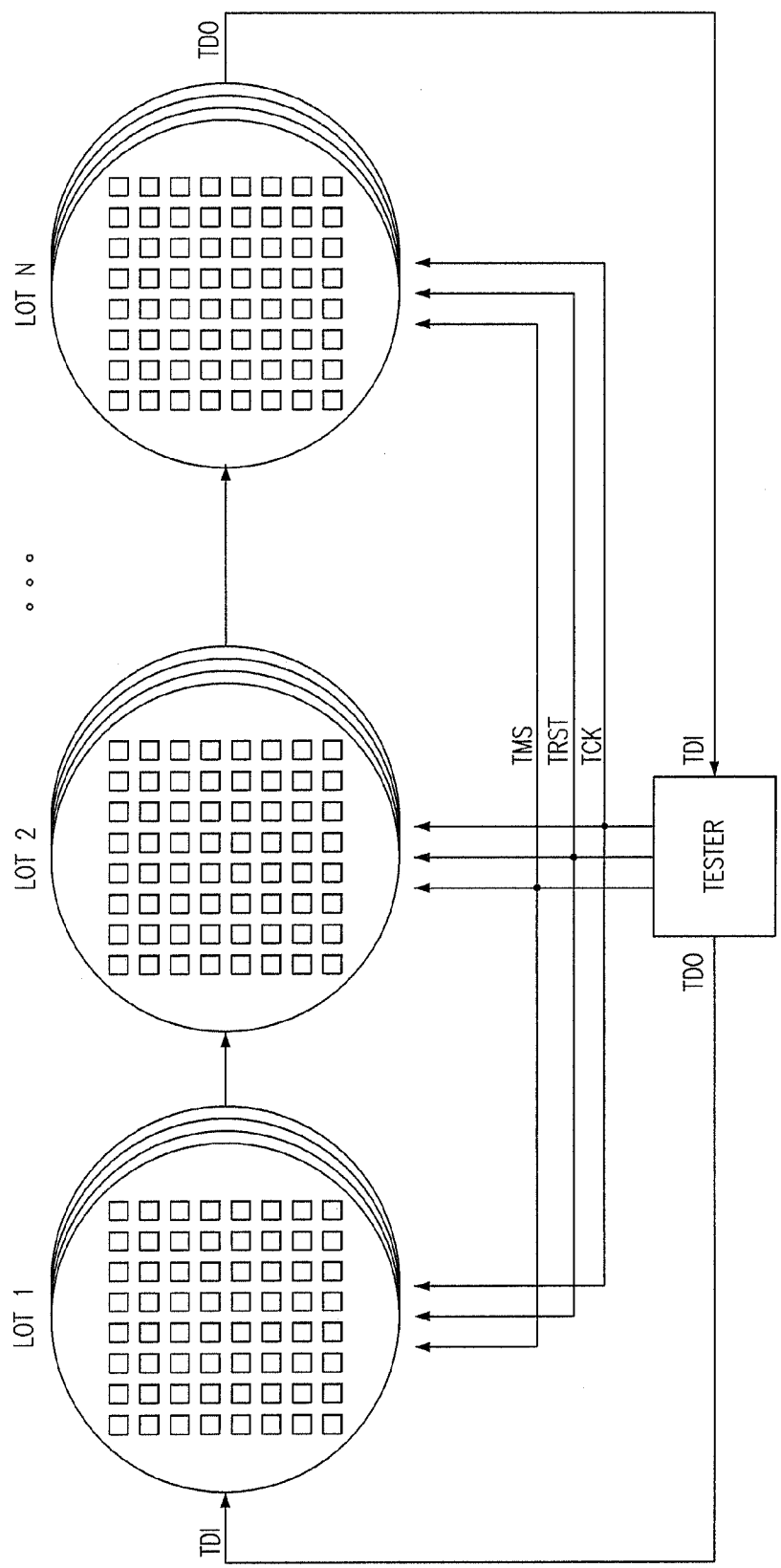
FIG. 29 is a representation of wafer lots 1-N beings tested.

FIG. 29 illustrates how the warping scan test concept could be used to test multiple lots 1-N. Each lot 1-N in FIG. 29 could be similar to the lot described previously in regard to FIG. 28. Each lot is shown interfaced to an external tester.

Figure 30:
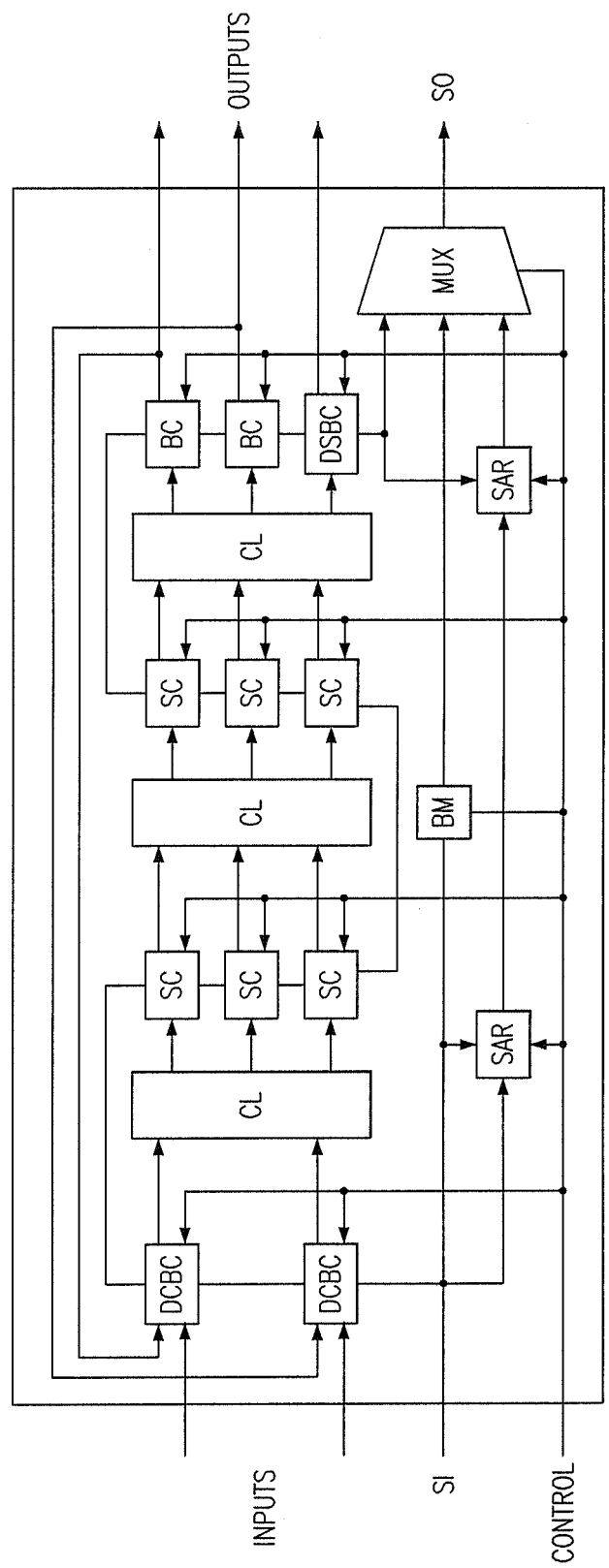
FIG. 30 is a block diagram of a circuit and scan path with conventional signature analyzers.

FIG. 30 illustrates one way to eliminate the possibility of aliasing as previously mentioned in regard to the data summing cell of FIGS. 12 and 13 by using conventional signature analyzers (SARs) at the serial input and serial output of a circuit's scan path. As mentioned earlier, aliasing can occur using the present Disclosure if a first faulty response bit is shifted into a data summing cell and a second faulty response bit is summed with the first faulty bit during a capture operation. XOR gates, which are used broadly in testing using signature analysis, have the distinction of outputting a 1 if the inputs are 10 or 01, or outputting a 0 if the inputs are 11 or 00, which is the root of the aliasing problem. Placing an input signature analyzer on the serial input to the first cell of the circuit's scan path and placing an output signature analyzer on the serial output from the last cell of the circuit's scan path can detect for aliasing during use of DSC and DSBC.

In FIG. 30, it is seen that the input and output signature analyzers collect signature during each shift clock. If during the warping scan test, a faulty bit is shifted into the circuit, the input signature will be different from the expected signature. If during the warping scan test, a faulty bit is shifted out of the circuit, the output signature will be different from the expected signature. By shifting out the input and output signatures from each circuit at the end of the warping scan test, the tester can compare each circuit's input and output signatures to see if aliasing has occurred on the response data it has received from the circuits. If the tester finds that the response data is correct and the signatures are correct, the test is valid. If the tester finds that the response data is correct but the signatures are incorrect, the test is invalid.

The signatures also serve a very useful purpose in aiding the tester in identifying which circuit first introduced a fault. For example, if 100 circuits are tested and a fault is output from the 50th circuit, the tester can identify that the output signature of the 50th circuit failed and go directly to the circuit as the one which caused the other 50 circuits to fail. Upon repairing the 50th circuit, the test is repeated to see if any of the trailing 50 circuits fail, since their tests were invalidated in the previous test by the failure of the 50th circuit.

The warping scan test concept becomes more and more effective in reducing test times as more circuits are added in series on the scan path. The opposite is true with conventional scan testing, i.e. conventional scan testing becomes less and less effective as more circuits are added in series. The examples in FIGS. 23-29 of using warping scan to test boards, boxes, systems, wafers, lots, and lot groups indicate how a company who produces these types of electrical products might exploit the benefit of this Disclosure broadly and standardize its use at every manufacturing level. Also an advantage of the Disclosure is that one simple tester could be used at every manufacturing level within a company, from die testing to missile testing.

Although this disclosure has treated circuits as all being on the same scan path, if parallel scan paths were used to test circuits using the warping scan test concept, additional reductions in test time will be seen.

In FIGS. 26-29, scan testing has been described as a way to test the internal circuitry of die on wafers. However, a complete wafer test needs to test the die input and output buffer circuitry as well. Conventional wafer testing uses mechanical probes that contact die pads to allow a tester to input and output test patterns. Since conventional wafer testing inputs and outputs test patterns via the functional pads, the input and output buffers are tested while the internal circuitry is being tested. However, in using scan to test die, the test patterns are input to and output from the internal circuitry via the TDI and TDO test pads. Therefore, when using scan to test die on wafer, the functional pads and associated input/output buffers are not tested. A method is needed to allow input/output buffers to be tested, both parametrically and functionally, without having to contact the pads using probes.

The present Disclosure provides for such buffer testing, as well as testing of electrostatic discharge protection circuitry and pad bus holders, without contacting the pads.

Figure 31:
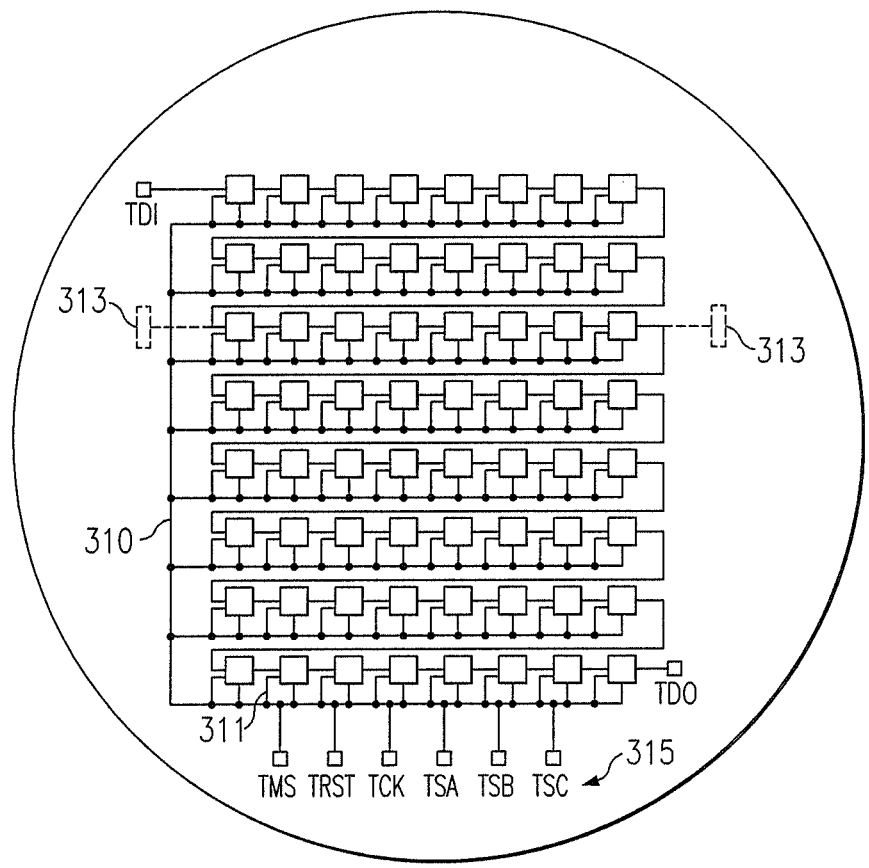
FIG. 31 is a representation of a wafer with additional bussing and test pads.
Figure 32:
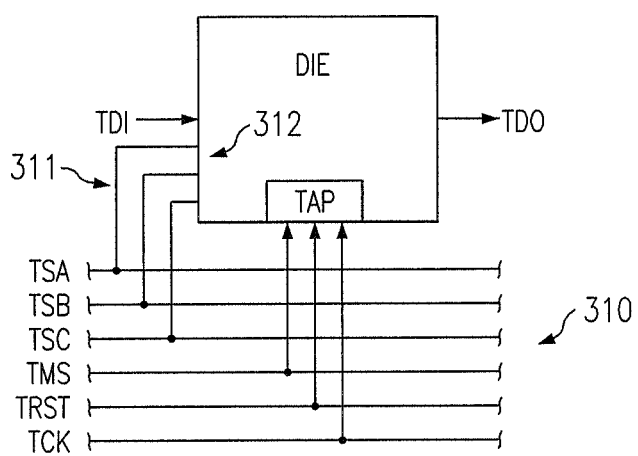
FIG. 32 is a block diagram of a test access port on a die.

Example FIG. 31 illustrates a wafer similar to that in FIG. 26 but including bussing 310, 311 and test pads at 315 for new test signals TSA, TSB, and TSC. Example FIG. 32 illustrates a die similar to that in FIG. 27 but including die pads at 312 connected to the TSA, TSB, and TSC wafer bussing conductors 311. In the arrangement shown in FIGS. 31 and 32, all die pads 312 are accessible from the common TSA-C wafer test pads at 315 via the wafer bussing conductors 311. Other access arrangements could be used.

For example, each row of die could have its own group of TMS, TCK, TDI, TDO, TRST, TSA, TSB, and TSC test pad signals, as well as power and ground, as indicated by the exemplary dotted boxed areas at 313. Partitioning the wafer's die into separate groups (rows in this case) allows simultaneous and parallel scan and buffer testing of each die in the groups, which can reduce overall test time.

Figure 33:
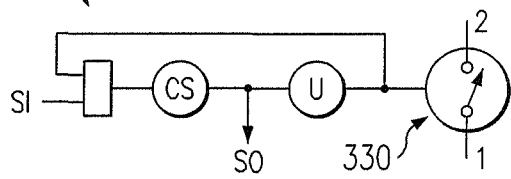
FIG. 33 is a block diagram of a conventional IEEE STD 1149.1 scan cell.

Example FIG. 33 shows a conventional IEEE STD 1149.1 scan cell having capture shift (CS) and update (U) memories. The output of the update memory is conventionally used to control a two terminal switch 330, such as a transmission gate, to make a connection between its terminals (1 & 2) or break a connection between its terminals.

Figure 34:
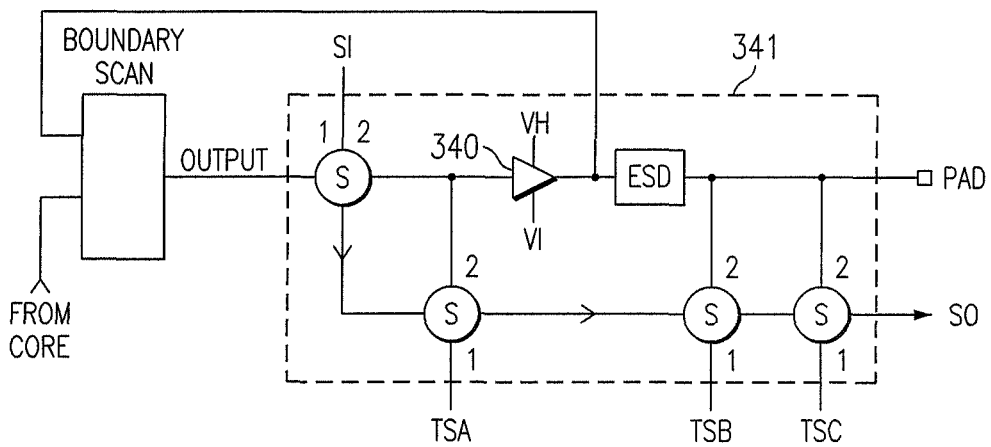
FIG. 34 is a block diagram of a circuit using four conventional scan cells S.

Example FIG. 34 shows an arrangement 341 including a 2-state digital output buffer 340, an electrostatic discharge (ESD) protection circuit, a conventional boundary scan circuit, and four of the scannable switches (S) of FIG. 33 connected in a scan path. A first switch is connected between the boundary scan circuit and the input to the output buffer, a second switch is connected between the input to the output buffer and a TSA node, and third and fourth switches are connected between the output of the output buffer and TSB and TSC nodes, respectively. In operation, the buffer receives a data signal from the core circuitry, via the boundary scan circuit, and outputs an amplified version of the data signal to the die pad. The buffer is connected to a high level voltage rail (Vh) and a low level voltage rail (Vl) which define the output voltage switching range of the buffer. An unloaded output buffer may output the full Vh and Vl levels. However, a loaded output buffer will output levels less than Vh and more than Vl due to the output buffer's internal high and low drive transistor resistances. The ESD circuit is positioned between the output buffer and the two parallel switches.

The output buffer can be tested conventionally by outputting test data from the boundary scan circuit to the input of the output buffer, then capturing the data output from the output of the buffer back into the boundary scan circuit. While boundary scan can test the logical operation of the buffer, it cannot test other electrical properties associated with the output buffer such as; (1) the buffer high and low drive strengths, (2) voltage level translation that might occur in the buffer (i.e. 5 v to 3 v or 3 v to 5 v), (3) propagation delays through the buffer, and (4) the ESD circuit.

Figure 35:
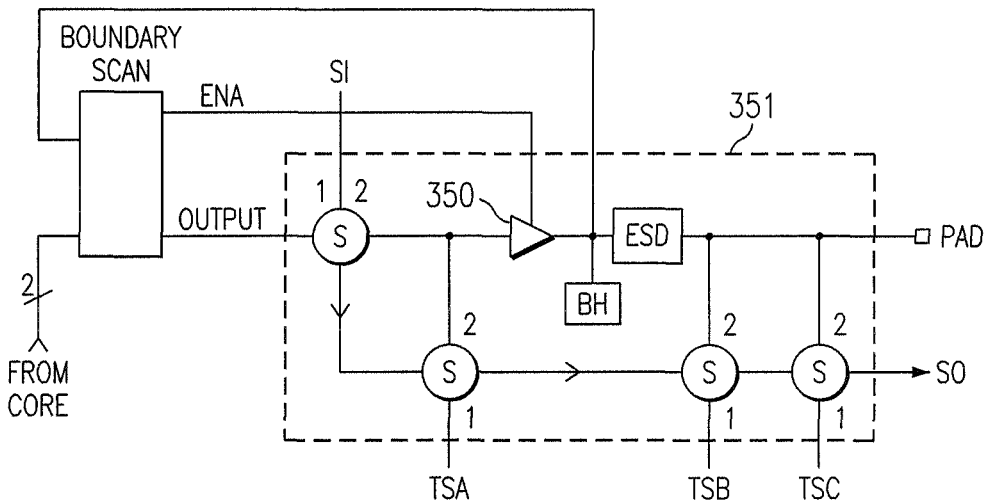
FIG. 35 is a block diagram of a circuit similar to that of FIG. 34.

Example FIG. 35 is similar to FIG. 34 and shows an arrangement 351 including a 3-state output buffer 350 having an off condition where its output is disabled from driving the pad, and having a conventional bus holder (BH) circuit to hold the pad at the last driven logic state prior to the buffer being disabled. An enable (Ena) control signal passes from the core through the boundary scan circuit to enable or disable the buffer's output. Testing of the buffer is similar to that described in FIG. 34 and is accomplished by the boundary scan circuitry enabling the buffer and outputting test data to the buffer input and capturing the results at the buffer output. While boundary scan can test the logical correctness of an enabled buffer to pass ones and zeros, boundary scan is not capable of testing that the output of the buffer is actually in a disabled state, especially if the bus holder is implemented. The switches and TSA-C connections shown in FIG. 35 provide for the tests (1)-(4) listed above relative to FIG. 34, plus they additionally provide; (5) a test that detects whether the buffer's output is actually disabled, and (6) a test that tests the operation of the bus holder.

Figure 36:
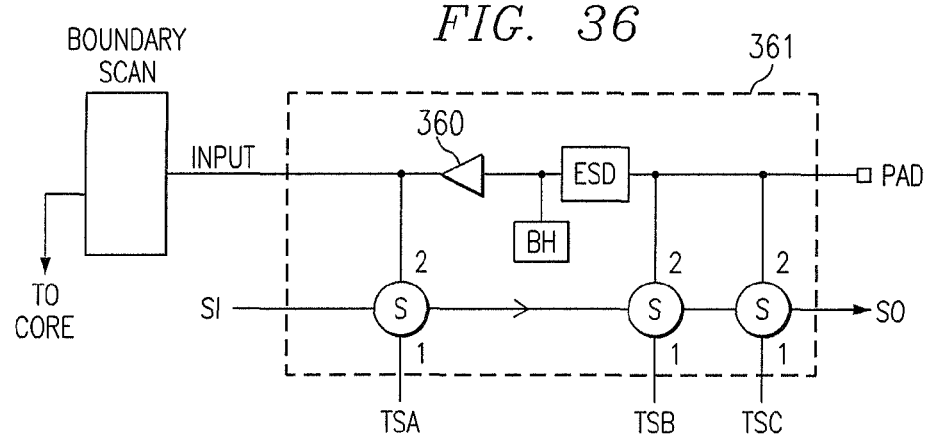
FIG. 36 is a block diagram of a circuit relating to an input buffer.

Example FIG. 36 is similar to FIGS. 34 and 35, but relates to an input buffer. The arrangement 361 includes a switch S connected between the TSA node and the output of input buffer 360, and two switches connected between the input of the input buffer and the TSB and TSC nodes, respectively. The switches on the input of the input buffer are connected between the ESD circuit and the pad. The switches provide the following tests of the input buffer; (1) test logical operation of input buffer, (2) test buffer input ranges, (3) test buffer hysteresis if so equipped, (4) test input voltage translation (i.e. 3 v to 5 v or 5 v to 3 v), (5) test operation of bus holder, and (6) test ESD circuit.

Figure 37:
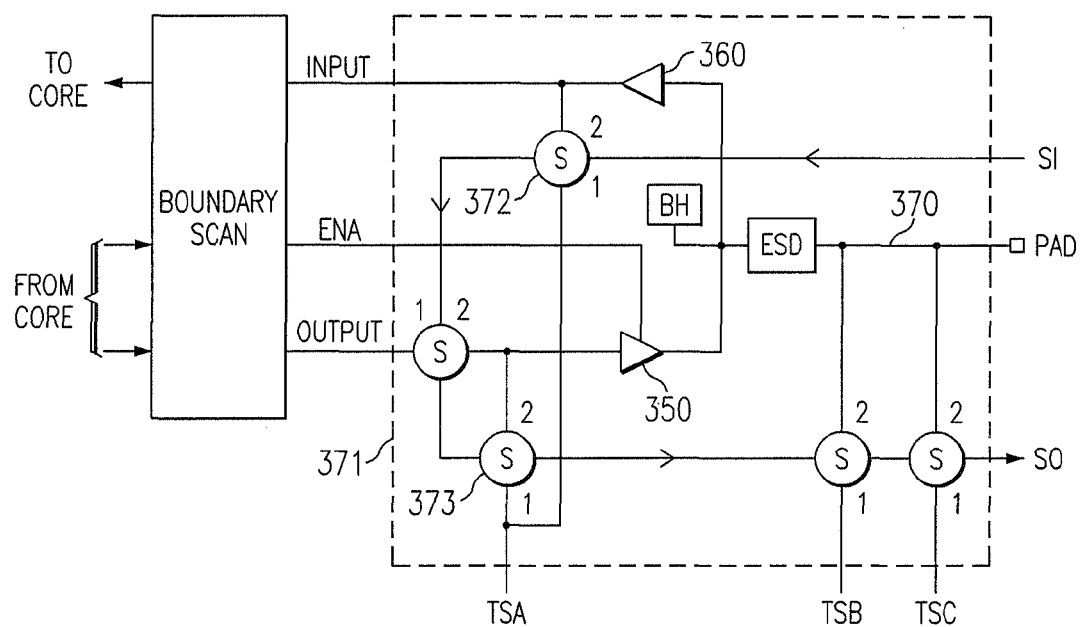
FIG. 37 is a block diagram of a circuit relating to a bi-directional pad.

Example FIG. 37 relates to a bidirectional (e.g. I/O) pad having both input and output buffers. The arrangement 371 includes a first switch connected between the output of the input buffer 360 and the TSA node, a second switch connected between the input of the output buffer 350 and the TSA node, a third switch connected between the output of the boundary scan circuit and the input to the output buffer, and fourth and fifth switches connected between the pad wire 370 and the TSB and TSC nodes, respectively. The fourth and fifth switches are connected between the ESD circuit and the pad. The functional operation of the bidirectional buffer can be tested using boundary scan by; (1) enabling the output buffer, (2) outputting test signals to the input of the output buffer, and (3) reading the test signals back from the output of the input buffer. The switches S provide all the tests previously mentioned in regard to the output buffers of FIGS. 34 and 35, and input buffer of FIG. 36. The switches connected to the pad wire are shared for testing both the input and output buffers.

In normal functional mode, the TSA-C switches shown in FIG. 34-37 are open and the switch between the boundary scan circuit and output buffers will be closed. When an output buffer is being tested, the TSA-C switches will be closed and the switch on the input of the output buffer will be opened. Likewise, when an input buffer is being tested, the TSA-C switches will be closed. Using switches like that shown in FIG. 33 allows individual selection of whether a switch is closed or opened. For example, it is possible to close any one or more of the TSA-C switches during normal functional mode, in order to monitor a functioning input or output signal(s). In another example, it is possible to open the switch between the boundary scan circuit and output buffer and close switch TSA to allow injecting a signal to be output from the output buffer during normal operation of the die.

If such switch control flexibility is not required, a single capture shift update scan cell, as shown in FIG. 33, could have its update output coupled to all switches 330 in any of FIGS. 34-36 to control the switches as a group to their closed or open state. If a single capture shift update scan cell were used on the input buffer of FIG. 36, its update output would be used to (1)

open all TSA-C switches and (2) close all TSA-C switches. If a single capture shift update scan cell were used on the output buffers of FIGS. 34 and 35, its update output would be used to (1) open all TSA-C switches and close the switch between the boundary scan circuit and buffer and (2) close all TSA-C switches and open the switch between the boundary scan circuit and buffer. In the bidirectional buffer of FIG. 37, a first capture shift update scan cell could be used to close or open the TSA switch 372 and the TSB and TSC switches, while a second capture shift update scan cell could be used to open or close the switch between the boundary scan circuit and output buffer, and appropriately close or open the TSA switch 373 and the TSB and TSC switches. The update outputs of the first and second capture shift update cells would be logically Ored to produce the control signal that opens/closes the TSB and TSC switches.

Figure 38:
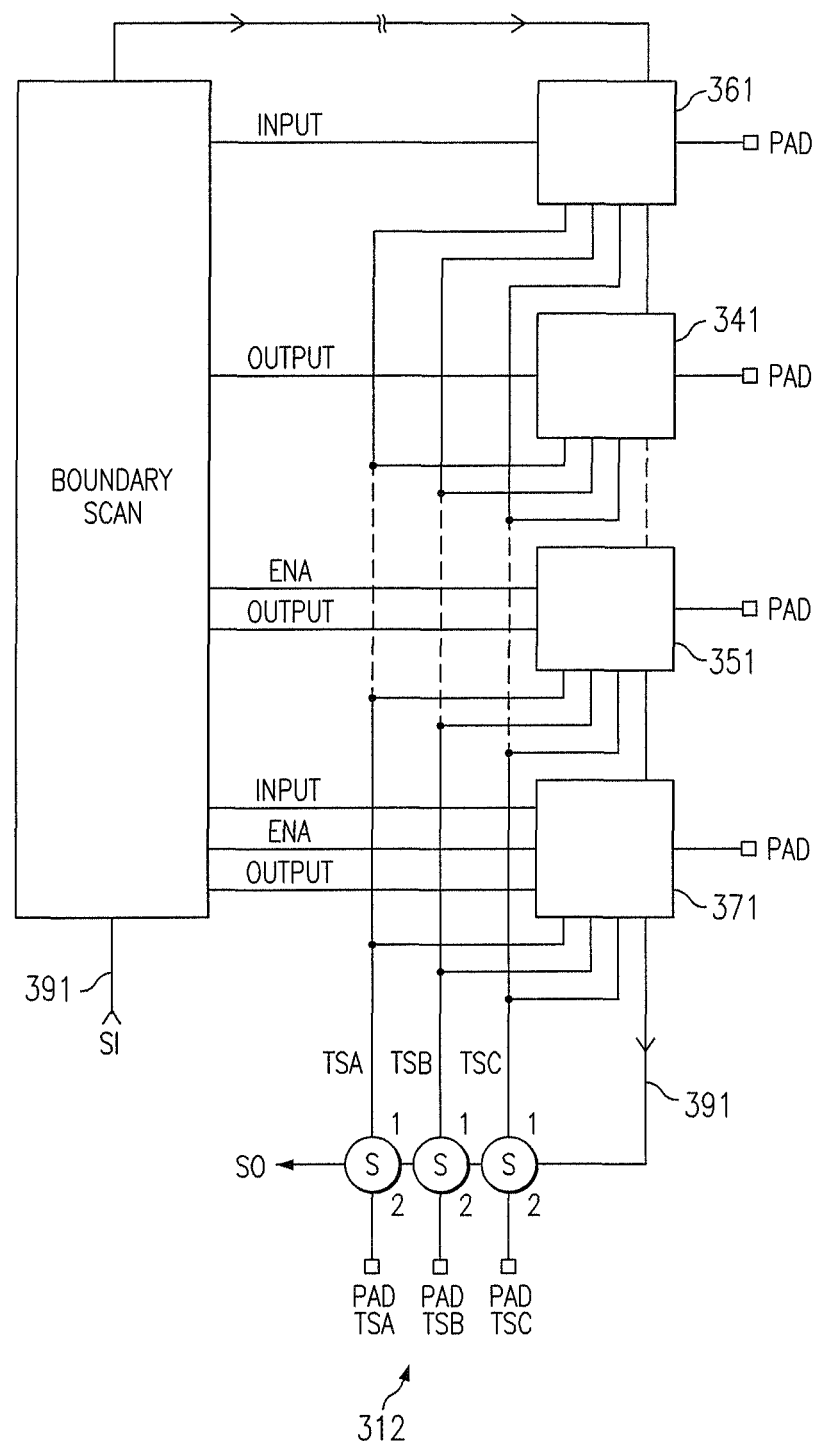
FIG. 38 is a block diagram of the circuits of FIGS. 34-37 bussed together on a die.

Example FIG. 38 shows how all the TSA nodes of FIGS. 34-37 can be bussed together on a die and connected through a FIG. 33 switch to a TSA pad on the die at 312. Likewise, all TSB and TSC nodes of FIGS. 34-37 can be bussed together on a die and connected through respective switches to TSB and TSC pads on the die at 312. The dotted lines indicate additional buffers connected to the TSA, TSB, and TSC bussing paths. A serial scan path 391 is routed through each buffer's switches, the TSA-C pad switches, and the boundary scan circuit to provide control to close or open the switches of each buffer during test. For example, a first scan operation can be performed to close the input buffer's switches (top) and the TSA-C pad switches to allow a tester, connected to the TSA-C pads, to access and test the input buffer via its associated TSA-C nodes. After the input buffer is tested, a second scan operation is performed to open the input buffer switches, maintain the TSA-C pad switches closed, and configure the output buffer switches (next to top) to allow tester access and testing of the output buffer. Similarly, subsequent scan operations can be used to access and test the remaining buffers on the die. In the case of the 3-state and bidirectional buffers, the boundary scan circuit will be controlled by scan to output the required enable control to the buffers to allow testing the buffers in their enabled and disabled states.

A proposed IEEE standard 1149.4 requires the TSB and TSC switches of FIGS. 34-37, as well as the TSB and TSC pads, pad switches and bussing paths of FIG. 38. These parts of the 1149.4 architecture can thus be reused to implement the present Disclosure. If the IEEE standard 1149.4 architecture is reused for the present Disclosure, the test circuit overhead is reduced to only the two switches (one being for TSA) connected to the input of an output buffer, the switch (for TSA) connected to the output of an input buffer, and the TSA pad, pad switch and bussing paths.

Figures 39A, 39B, 39C:
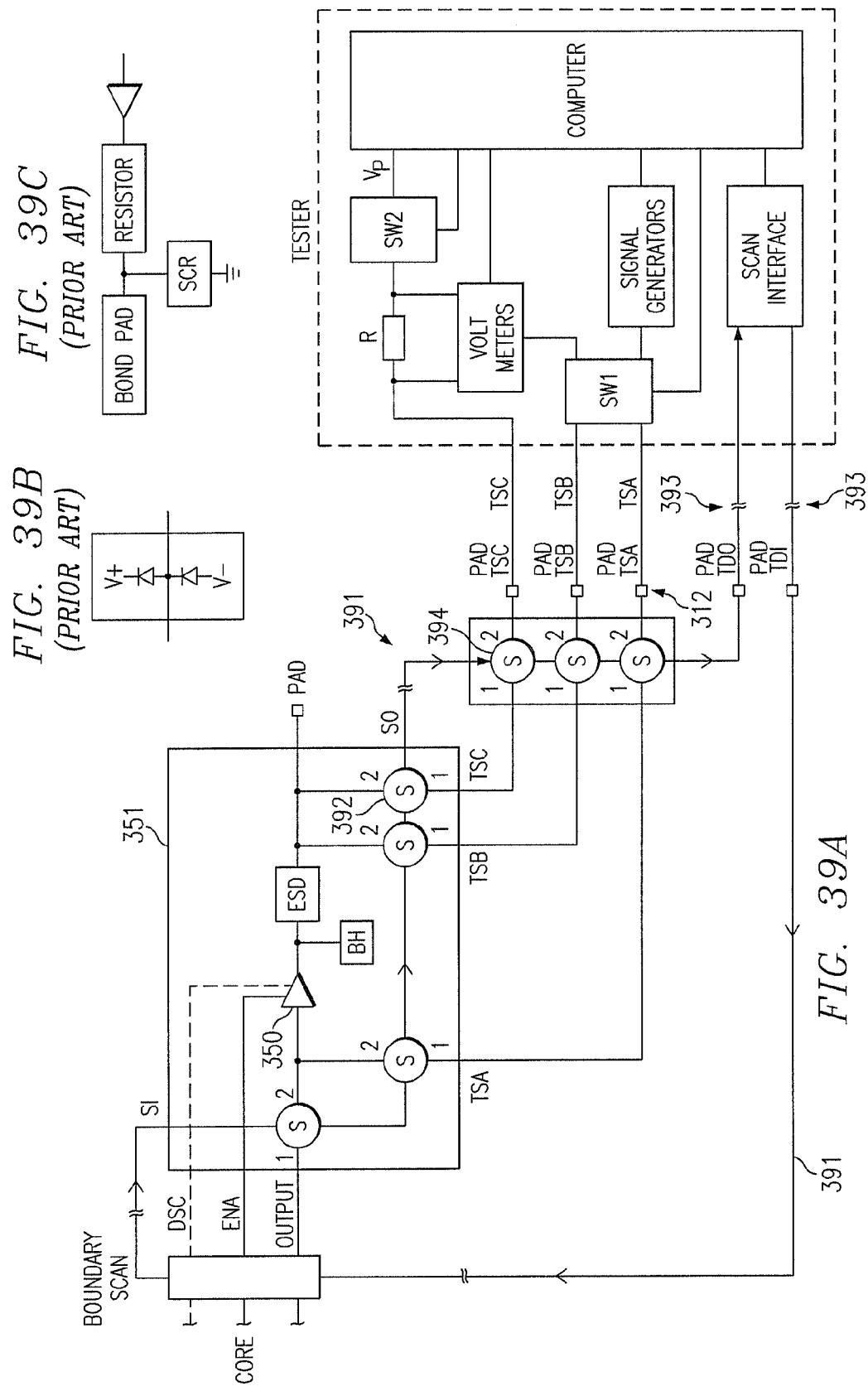
FIG. 39A is a block diagram of a 3-state output buffer.
FIG. 39B is a block diagram of a known ESD circuit.
FIG. 39C is a block diagram of another known ESD circuit.

FIG. 39A shows an example of how probeless testing of a 3-state output buffer occurs using the present Disclosure. While this example uses a 3-state output buffer, it will be clear that 2-state output buffers are tested similarly, except 2-state output buffers do not require an output disable (i.e. high impedance) test. Test access to the die is provided by a tester that contacts the die via the die's TSA-C pads and IEEE STD 1149.1 scan interface pads (TCK, TMS, TDI, TDO). For clarity, the tester's serial interface only shows the scan test data input (TDI) and scan test data output (TDO) terminals. Although only a single arrangement 351 and its associated boundary scan circuitry are shown, the internal scan path 391 of the die should be understood to pass through other arrangements 351, 341, 361 and 371 and their associated boundary scan circuits inside the die (see FIG. 38). Also, the external scan path 393 may traverse other die connected therein between the tester and the illustrated die.

In the example of FIG. 39A, the tester includes a conventional scan interface for controlling scan operations, signal generators for producing DC and AC test signals, voltmeters for measuring DC and AC voltages, a first switching circuit (SW1) for connecting the tester's TSA or TSB terminals to the voltmeter or signal generators, a second switch circuit (SW2) for connecting the tester's TSC terminal, through a known resistor R, to a programmable voltage source (Vp), and a conventional test control computer for controlling the overall operation of the tester.

As previously mentioned, using boundary scan the output buffer can be tested for correct logical operation. However, since the buffer output is not loaded, as it would be if the die were tested using conventional probe testing, the boundary scan test does not test the strength of the buffer's high and low drive transistors. In FIG. 39A, the TSC buffer and pad switches 392 and 394 should be designed with a relatively low "on" resistance, since the Disclosure uses the TSC path to provide a load for output buffers. The remaining switches in the TSA and TSB paths can have higher "on" resistance since the Disclosure uses these paths to input signals to and/or monitor signals from buffers.

To test the output buffer drive strengths using the present Disclosure, and referencing FIG. 39A, a scan operation is performed to; (1) enable the output buffer via the boundary scan circuit's Ena signal, (2) open the switch between the boundary scan circuit and the output buffer, and (3) close all of the TSA-C buffer and pad switches. Following this scan operation, the tester makes a connection through SW1 to allow inputting a signal from a signal generator to the input of the output buffer, via the TSA buffer and pad switches. The tester also makes a connection through SW1 to allow a voltmeter to monitor the buffer output via the TSB buffer and pad switches. The tester inputs a signal from the signal generator, via the TSA path, to cause a high output from the buffer and measures this value using a voltmeter via the TSB path. Since the buffer output is not loaded (SW2 is open), the measured value, Vmh, should be equal to the high level rail voltage (Vh) of the buffer (if CMOS) or a known voltage slightly below the high level rail voltage (e.g. Bipolar). Next the tester inputs a signal via the TSA path to cause a low output from the buffer and measures this value using a voltmeter via the TSB path. Again since the buffer output is not loaded (SW2 is open), the measured value, Vml, should be equal to (CMOS) or slightly above (Bipolar) the low level rail voltage (Vl) of the buffer.

Note that the TSC switches could be left open during the unloaded test described above if closing them causes the buffer output to experience an undesired capacitive load. An advantage of closing them along with the TSA and TSB switches is that it eliminates having to perform another scan operation in preparation for the loaded test described below.

Next, the tester inputs a signal from the signal generator via the TSA path to cause the buffer to output a high level voltage. The tester programs a voltage on Vp that is lower than the buffer's unloaded high level output voltage and makes a connection between the buffer's output and Vp, via the two TSC switches, the known resistor (R), and SW2. Programming Vp to be a lower voltage than the buffer high output voltage causes current to flow from the buffer through resistor R via the TSC signal path. This TSC path connection is used to provide a load on the buffer output to Vp. If, for example, SW2 is a relay with a closed resistance of 0.1 ohm, the known resistance R is 10 ohms, the "on" resistance of the TSC pad switch is 50 ohms, and the "on" resistance of the TSC buffer switch is 100 ohms, the TSC path provides a load of less than 200 ohms to test the buffer's high output drive level.

Next, the tester uses a voltmeter to measure the voltage (Vr) across the known resistor R to determine the output current Io flowing from the buffer through resistor R via the TSC path. Next, the tester uses a voltmeter to measure the voltage at the output of the buffer (Vo) via the TSB path. As is conventional, the voltmeters have high input impedance to prevent them from affecting the voltage measurements taken, i.e. no significant current flows into or from the voltmeters. By knowing the buffer's unloaded high voltage value Vmh as previously measured, the high drive resistance (Rh) of the output buffer can be determined by dividing the voltage difference between Vmh and Vo by the determined output current Io, i.e. Rh=(Vmh−Vo)/Io.

To measure the low drive resistance of the output buffer, the tester controls the signal generator to input a signal on the TSA path to cause the buffer to output a low level voltage. The tester programs a voltage on Vp that is higher than the buffer's unloaded low level output voltage and makes a connection between the buffer's output and Vp, via the two TSC switches, the known resistor (R), and SW2. Programming Vp to be a higher voltage than the buffer low output voltage causes current to flow from Vp to the buffer via the TSC signal path. Next, the tester measures the voltage (Vr) across the known resistor R to determine the input current Ii to the buffer. Next the tester measures the voltage output (Vo) of the buffer via the TSB path. By knowing the buffer's unloaded low voltage value Vml from a previous measurement, the low drive resistance (R1) of the output buffer can be determined by dividing the voltage difference between Vo and Vml by the determined input current Ii, i.e. R1=(Vo−Vml)/Ii.

Some output buffers may permit programmability of their high and/or low output drive strengths. This capability is shown by the dotted line drive strength control (DSC) input to the output buffer. In FIG. 39A, the DSC is shown coming from a register or memory within the IC core via the boundary scan register. Alternately, the drive strength control could come solely from the boundary scan register. Stored drive strength control data determines the high and/or low drive strength of the output buffer. The present Disclosure can be used to test the various drive strength settings of output buffers having this feature by outputting a drive strength setting to the buffer from the boundary scan register and repeating the above described high and low drive strength tests (Io and Ii tests) for each possible drive strength setting.

The present Disclosure can also be used to test buffers that translate voltage levels received at their input into different voltage levels driven from their output. For example, the output buffer of FIG. 39A may receive from the core a signal that switches between 0 and 3 volts and output to the pad a corresponding signal that switches between 0 and 5 volts.

To test an unloaded output buffer's capability to translate an input signal of a first given voltage swing into an output signal of a second given voltage swing, the following steps occur. A scan operation is performed to: (1) enable the buffer, (2) open the switch between the buffer and boundary scan circuit, and (3) close the switches in the TSA-C paths between the buffer and tester. Next, with SW2 open, the tester is setup to input a signal of a first given voltage swing to the input of the buffer, via a signal generator and the TSA path, and measure the output response of the buffer, via the TSB path, using a voltmeter to determine if the buffer outputs the expected voltage swing.

To test a loaded output buffer's capability to translate an input signal of a first given voltage swing into an output of a second given voltage swing, the same test as described above is performed except SW2 is closed to make a connection to Vp to provide a load on the buffer output via the TSC path. When the buffer output is set high, Vp is programmed to be at a lower voltage to emulate a load that sinks current from the buffer. When the buffer output is set low, Vp is programmed to be at a higher voltage to emulate a load that sources current into the buffer. During each loaded buffer output state, a voltmeter is used to measure the buffer's output voltage via the TSB path.

The propagation delay of the output buffer of FIG. 39A can be tested by enabling the buffer (if a 3-state type) and opening the switch between the buffer and boundary scan circuit, followed by inputting test signals to the buffer input via the TSA path (switches closed) and receiving test signals from the buffer output via the TSB path (switches closed). The TSC path can provide a load (SW2 closed) or not provide a load (SW2 open) on the buffer output signal during test. While this is not an exact propagation delay test, due to the loading effect the TSA and TSC paths have on the signals, it does give an indication of the propagation delay through the buffer. The computer is capable of the conventional function of measuring the time delay between when a test signal is transmitted from a signal generator and received at a voltmeter.

In FIG. 39B, one conventional form of the ESD circuit of FIG. 39A is shown consisting of two diodes both connected to the pad wire and each individually connected to the positive (V+) and negative (V−) voltage supplies of the die. The diode connected between the pad wire and V+ will conduct current from the pad wire to V+ if the voltage on the pad wire increases enough to forward bias the diode. Likewise, the diode connected between the pad wire and V− will conduct current from V− to the pad wire if the voltage on the pad wire decreases enough to forward bias the diode. The diodes serve to clamp the pad wire voltages to being no more positive than V+ plus the diode forward bias voltage drop and no more negative than V− minus the diode forward bias voltage drop.

To test the diode between the pad wire and V+, the tester disables the 3-state buffer's output and closes the TSB and TSC paths. Next the tester inputs an increasing voltage level to the buffer output via the TSC path and Vp and monitors the buffer output voltage via TSB. The voltage on TSB will be equal to the voltage on TSC as long as the diode is not forward biased. When the voltage output on TSC exceeds V+ by an amount sufficient to forward bias the diode, the voltage input on TSB will be clamped to V+ plus the forward bias voltage drop across the diode. Increasing the voltage at Vp will result in a greater voltage drop across the switches in the TSC path and across R because of the increase in current flow through the diode to V+. However, if the diode is good, the voltage at the output of the buffer will remain clamped at V+ plus the diode voltage drop. If the diode is faulty, the voltage on the buffer output will increase with the voltage at Vp.

To test the diode between the pad wire and V−, the tester disables the 3-state buffer's output and closes the TSB and TSC paths. Next the tester inputs a decreasing voltage level to the buffer output via the TSC path and Vp and monitors the buffer output voltage via TSB. The voltage on TSB will be equal to the voltage on TSC as long as the diode is not forward biased. When the voltage output on TSC is less than V− by an amount sufficient to forward bias the diode, the voltage input on TSB will be clamped to V− minus the forward bias voltage drop across the diode. Decreasing the voltage at Vp will result in a greater voltage drop across the switches in the TSC path and across R because of the increase in current flow through the diode from V−. However, if the diode is good, the voltage at the output of the buffer will remain clamped at V− minus the diode voltage drop. If the diode is faulty, the voltage on the buffer output will decrease with the voltage at Vp.

If the buffer in FIG. 39A were a 2-state buffer, the TSA path would be closed to input a signal causing the buffer output to go high. The voltage input on TSC is then increased starting from the buffers high level output voltage to a level that should forward bias the diode between the pad wire and V+ to test the top diode. Next, a signal on TSA is input to cause the buffer output to go low. The voltage input on TSC is then decreased starting from the buffer's low level output voltage to a level that should forward bias the diode between the pad wire and V− to test the bottom diode.

In prior art FIG. 39C, another conventional output ESD protection circuit is shown. This ESD circuit has a series resistor between the pad and output buffer and an SCR having a first node connected between the series resistor and pad and a second node connected to ground. In response to a higher than normal voltage input to the pad, the buffer's output will breakdown and conduct current. The series resistor protects the output buffer during breakdown by limiting the current flow from the pad to the output buffer. The current flow from the pad to the output buffer will cause a voltage to be developed across the series resistor. The sum of the voltage at the output of the buffer and the voltage developed across the series resistor provides a sufficient trigger voltage to turn the SCR on to allow current from the pad to be safely shunted to ground via the SCR.

To test the operation of the FIG. 39C ESD circuit conventionally, a tester would probe the pad and inject a voltage that would trigger the SCR. To test the FIG. 39C ESD circuit using the present Disclosure (i.e. without probing), and assuming the ESD circuit of FIG. 39C is positioned as shown in FIG. 39A, the tester inputs an increasing voltage to the pad via the TSC path and monitors the pad voltage via the TSB path. When the voltage input to the pad reaches a level that causes the output buffer to breakdown and conduct current, the sum of the output buffer and series resistor voltages provides the trigger level required to turn the SCR on. The tester can detect when the SCR turns on by monitoring the pad voltage on the TSB path and/or by monitoring for an increased voltage drop across R as a result of the increased current flow through the SCR via the TSC path.

In FIG. 39C, a diode is conventionally used to protect the output buffer against a lower than expected voltage at the pad (as described above in regard to FIG. 39B), and can be tested as previously described using the present Disclosure.

To test that the output buffer can be disabled, the tester performs a scan operation to disable the buffer by the Ena signal from the boundary scan circuit and closes the switches in the TSB and TSC paths. Next the tester inputs a varying voltage from Vp to the pad wire via the TSC path and monitors for the same voltage to be returned to the tester via the TSB path, the voltmeter being conventionally capable of measuring time-varying voltages. If the buffer is disabled, the pad wire voltage will follow the varying Vp voltage. If the buffer is not disabled, the pad wire voltage will not follow Vp. Also the tester can detect a non-disabled buffer by sensing a voltage drop across R due to current flow on TSC in response to a fixed voltage output from the buffer and a varying voltage output on Vp.

To test the bus holder, the tester performs a scan operation to disable the buffer by the Ena signal from the boundary scan circuit and closes the switches in the TSB and TSC paths. Next the tester inputs a logic high level voltage from Vp to the pad wire via the TSC path to set the bus holder high. The TSB path can be used to read the high from the pad wire. Next the tester inputs a decreasing voltage level from Vp to the pad wire via the TSC path. While Vp is decreasing, the tester monitors the voltage drop across R to detect the extremely small current flow from the bus holder to Vp as the bus holder, typically a pair of cross-coupled inverters, attempts to maintain the high logic state. Eventually, the voltage from Vp will reach a point where the bus holder will trip from attempting to hold a logic high to holding a logic low on the pad wire. When the bus holder trip point occurs, the small current it has supplied to Vp in its attempt to maintain the logic high will cease, and the bus holder will begin to sink a small current from Vp. The tester can detect this change of current direction by seeing that the polarity of the small voltage drop across R has changed.

Next the tester inputs an increasing voltage level from Vp to the pad wire via the TSC path. While Vp is increasing, the tester monitors the voltage drop across R to detect the extremely small current flow to the bus holder from Vp as the bus holder attempts to maintain the low logic state. Eventually, the voltage from Vp will reach a point where the bus holder will trip from attempting to hold a logic low to holding a logic high on the pad wire. When the bus holder trip point occurs, the small current it has sunk from Vp in its attempt to maintain the logic low will cease, and the bus holder will begin to source a small current to Vp. The tester can detect this change of current direction by seeing that the polarity of the small voltage drop across R has changed.

If the tester does not see any voltage drop across R as it moves Vp from one logic level to the next, then the bus holder is defective. It is advantageous during this bus holder test if R has a relatively high resistance of, for example, 10 M ohms to ease detection of the voltage drop across R caused by the small current sourced and sunk by the bus holder.

Figures 40A, 40B:
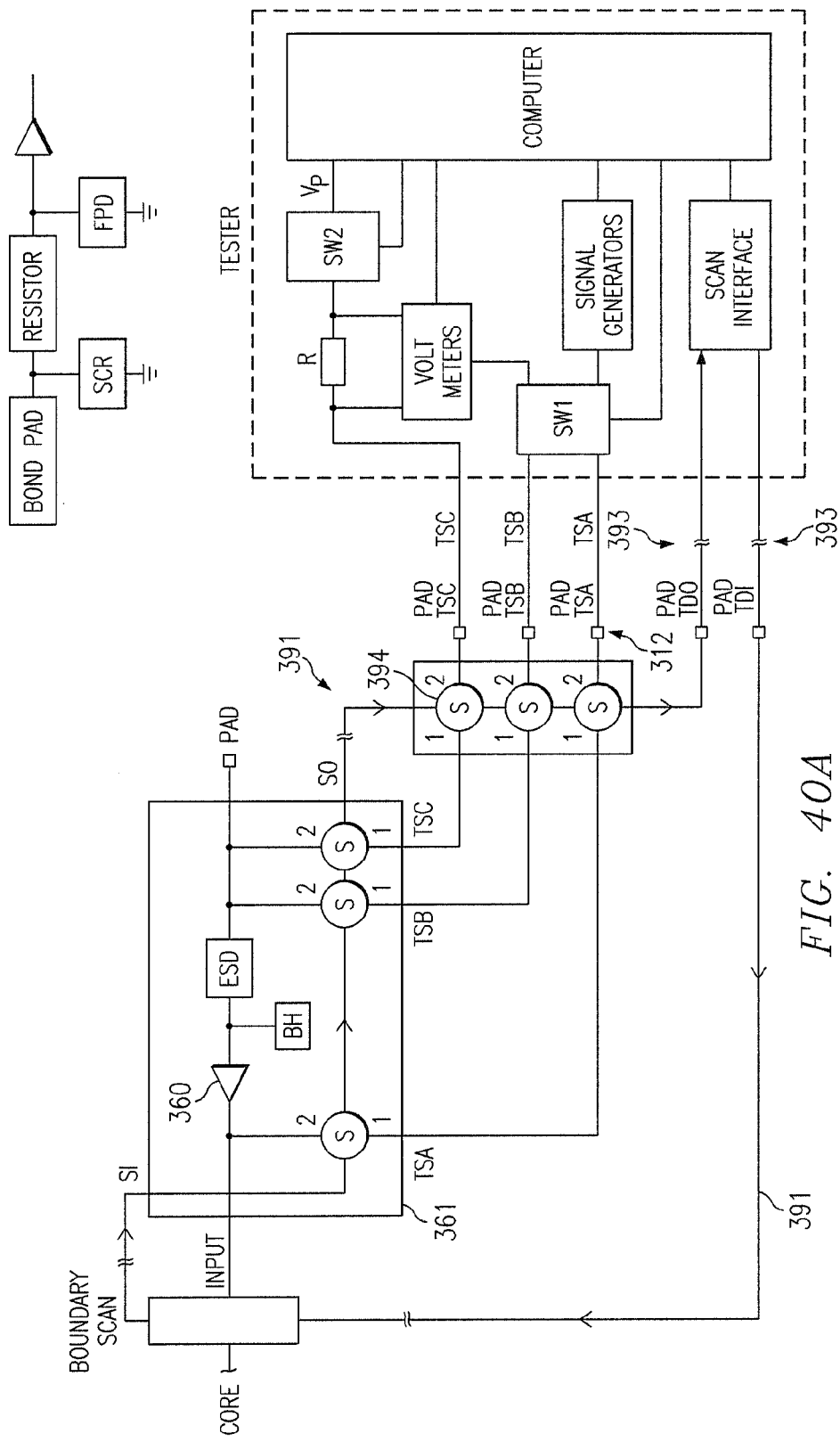
FIG. 40A is a block diagram of a tester and an input buffer.
FIG. 40B is a block diagram of a known ESD circuit.

Using the arrangement shown in example FIG. 40A, the following tests of an input buffer can be performed.

To test the logical operation of the input buffer of FIG. 40A, the tester performs a scan operation to close the switches in the TSA and TSB paths. Next the tester inputs a signal from a signal generator to the input of the input buffer via the TSB path and reads the signal output from the input buffer via the TSA path. The tester verifies whether the input buffer responds correctly to all signal inputs.

Digital input buffers are typically designed with input voltage ranges such that, if the input voltage remains within a given input range, the buffer will continue outputting the desired logic state. Different technologies, like CMOS and Bipolar, have different input ranges. To test the input ranges of the input buffer of FIG. 40A, the tester performs a scan operation to close the switches in the TSA and TSB paths. Next the tester inputs a low signal from a signal generator to the input of the input buffer via the TSB path to set the buffer output low, and verifies this low via the TSA path. Next the tester increases the input voltage to the buffer to the maximum level within the lower input range, and then checks to see if the buffer output remains low by reading the buffer output level via the TSA path. Next the tester inputs a high signal to the input of the buffer via the TSB path to set the buffer output high, and verifies this high via the TSA path. Next the tester decreases the input voltage to the buffer to the minimum level within the upper input range, and then checks to see if the buffer output remains high by reading the buffer output via the TSA path.

Some digital input buffers are designed with input hysteresis that will cause the buffer output to go high only after a first input voltage level (threshold) has been received. Once the buffer output goes high, it will not return low until after a second, lower input voltage level (threshold) has been received. Likewise, the input buffer output will go low when the second input voltage level is received and will not return high until after the first input voltage level is received. Hysteresis is used to reduce the possibility of noise on input buffer inputs from causing state changes on input buffer outputs.

To test hysteresis on the input buffer of FIG. 40A, the tester performs a scan operation to close the switches in the TSA and TSB paths. Next the tester inputs from a signal generator to the input of the input buffer via the TSB path a voltage low enough (i.e. below the aforementioned second voltage level) to set the buffer output low, and verifies this low via the TSA path. Next the tester increases the input to the buffer above the first input voltage level, then lowers it below the first input voltage level, but not below the second input voltage level, and then returns it to above the first input voltage level. During this operation, the tester verifies, via the TSA path, that the buffer output changes from low to high in response to receiving input above the first input voltage level, and remains high while the input is taken below the first input voltage level and then back above the first input voltage level. Next the tester decreases the input to the buffer below the second input voltage level and then raises it above the second input voltage level, but not above the first input voltage level, then returns it to below the second input voltage level. During this operation, the tester verifies that the buffer output changes from high to low in response to receiving input below the second input voltage level, and remains low while the input is taken above the second input voltage level and then back below the second input voltage level.

In FIG. 40A, the input buffer voltage translation is tested as previously described in regard to the output buffer of FIG. 39A, with the exception that the tester uses the TSB path to input signals to the buffer and the TSA path to receive translated signals from the buffer.

In FIG. 40A, the bus holder for input buffers is tested as previously described in regard to the output buffer of FIG. 39A.

In FIG. 40A, diode ESD circuitry, as shown in FIG. 39B, is tested as previously described in regard to the output buffer description of FIG. 39A.

In prior art FIG. 40B, a conventional input ESD protection circuit is shown. This ESD circuit has a series resistor between the pad and input buffer, a silicon controlled rectifier (SCR) having a first node connected between the series resistor and pad and a second node connected to ground, and a field plate diode (FPD) having a first node connected between the series resistor and input buffer and a second node connected to ground. In response to a higher than normal voltage input to the pad, the FPD will conduct current and clamp the voltage input to the buffer to a level that will not damage the buffer. When the FPD conducts current, the current will flow from the pad through the series resistor and FPD to ground. As a result of this current flow, a voltage will develop across the series resistor. The sum of the FPD clamp voltage at the input of the buffer and the voltage developed across the series resistor provides a sufficient trigger voltage to turn the SCR on to allow current from the pad to be safely shunted to ground via the SCR.

To test the FIG. 40B ESD circuit as it is shown positioned in FIG. 40A, the tester inputs an increasing voltage to the pad via the TSC path and monitors the pad voltage via the TSB path. When the voltage input to the pad reaches a level that causes the FPD to conduct, the sum of the FPD and series resistor voltages will trigger the SCR to turn on. The tester can detect this condition by monitoring voltage on the TSB path and/or by monitoring for an increased voltage drop across R as a result of the increased current flow through the SCR via the TSC path.

In testing the ESD circuit of FIG. 39B, each of the TSB and TSC switches can be connected to the pad wire at any desired point (on either side of the ESD circuit) in FIGS. 39A and 40A. However, when testing the ESD circuits of FIGS. 39C and 40B, the TSB and TSC switches should both be connected to the pad wire between the pad and the ESD circuit, as shown in FIGS. 39A and 40A.

Figure 41:
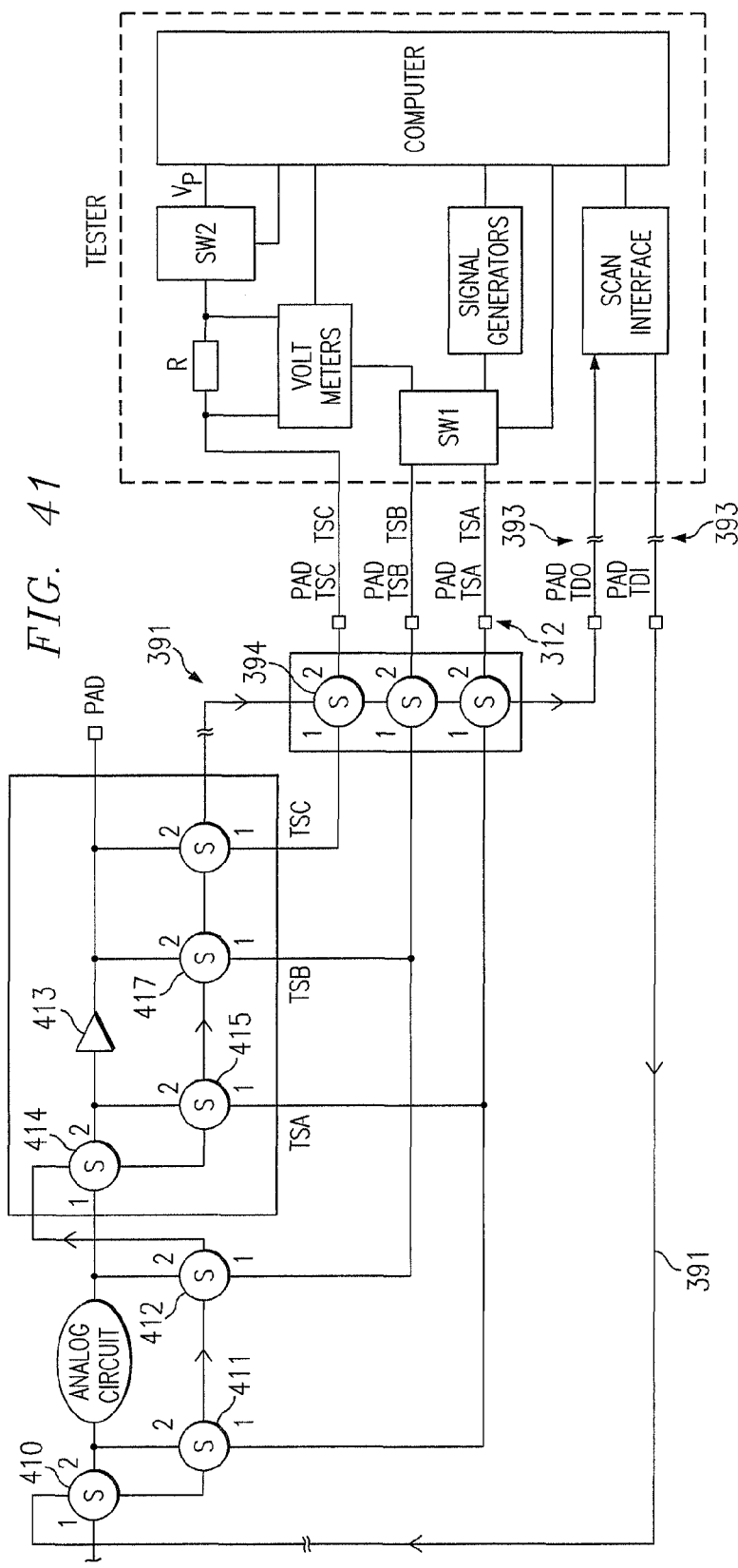
FIG. 41 is a block diagram of a tester and an analog output buffer.

Example FIG. 41 illustrates how the present Disclosure can test an analog output buffer 413 and an analog circuit associated with the analog output buffer, which analog circuit and buffer are, for clarity, shown on the same die and scan path as the digital core of FIGS. 39A and 40A. A difference between FIGS. 39A and 41 is that FIG. 41 has at 410 and 411 two additional switches S placed on the input of the analog circuit and at 412 an additional switch S placed on the output of the analog circuit. The first input switch 410 is used to make or break a connection between the analog circuit input and other circuits, and the second input switch 411 is used to make or break a connection between the analog circuit input and the tester via the TSA pad. The output switch 412 is used to make or break a connection between the analog circuit output and the tester via the TSB pad.

Testing of the analog output buffer is similar to the testing of the digital output buffer previously described in FIG. 39A. At the beginning of the analog buffer test, the tester performs a scan operation to open switches 411, 412 and 414, and close the switches in the TSA, TSB, and TSC paths to connect the buffer to the tester.

Following this scan operation, testing of the analog buffer is accomplished by inputting analog signals to the buffer via the TSA path and monitoring the analog signals at the buffer output via the TSB path. Providing a load on the buffer output, to measure its drive strength and high and low drive resistance, is accomplished via the TSC path as previously described in regard to FIG. 39A. If the buffer were a 3-state type, the disabled state of the buffer could be tested as previously described in FIG. 39A.

Testing of the analog circuit is similarly achieved. At the beginning of the analog circuit test, the tester performs a scan operation to open the switches 410, 414, 415 and 417, and to connect the analog circuit to the tester via the switches 411 and 412. Following this scan operation, testing of the analog circuit is accomplished by the tester inputting analog signals to the circuit via the TSA pad and monitoring the analog signals at the circuit output via the TSB pad. To shorten the test time, the analog buffer test can be combined with the analog circuit test by closing the switch 414, opening switch 412, and closing switch 417 on the TSB path to allow the tester to monitor the analog circuit output via the analog buffer's output.

Figure 42:
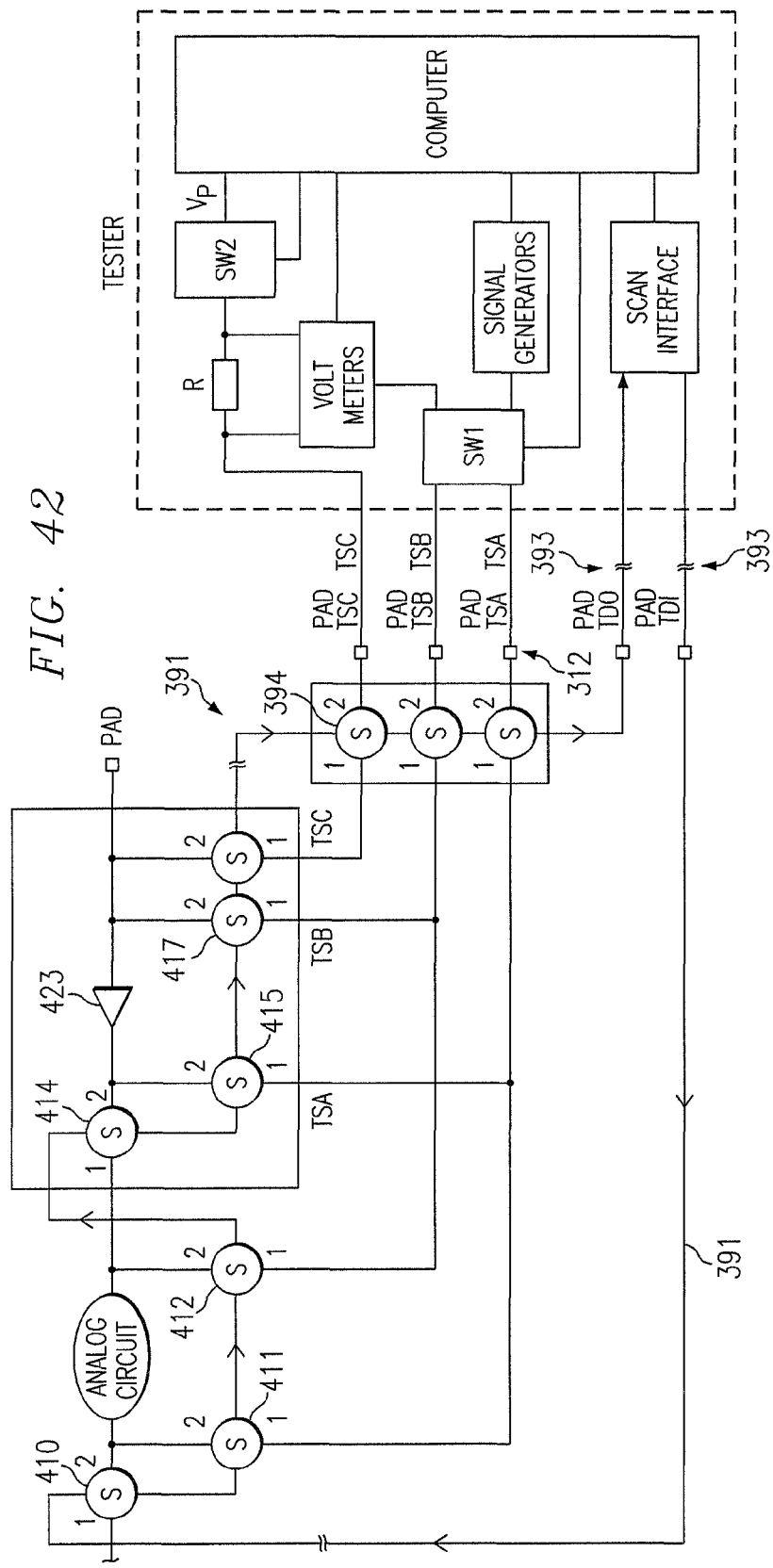
FIG. 42 is a block diagram of a tester and an analog input buffer.

Example FIG. 42 is similar to FIG. 41 and illustrates how the present Disclosure can test an analog input buffer 423 and an analog circuit associated with the analog input buffer. The circuit and buffer to be tested are shown for clarity on the same die and scan path illustrated in FIGS. 39A, 40A and 41.

Testing of the analog input buffer 423 is similar to the testing of the digital input buffer previously described in FIG. 40A. At the beginning of the analog input buffer test, the tester performs a scan operation to open switches 411, 412 and 414, and close the switches in the TSA, TSB, and TSC paths to connect the buffer to the tester. Following this scan operation, testing of the analog buffer is accomplished by inputting analog signals to the buffer via the TSB path and monitoring the analog signals at the buffer output via the TSA path.

Testing of the analog circuit is similarly achieved. At the beginning of the analog circuit test, the tester performs a scan operation to open switches 410 414, 415 and 417, and close switches 411 and 412. Following this scan operation, testing of the analog circuit is accomplished by the tester inputting analog signals to the analog circuit via the TSB pad and monitoring the analog signals at the analog circuit output via the TSA pad. The analog input buffer test can be combined with the analog circuit test by closing switch 414, opening switch 412, and closing switch 417 to allow the tester to stimulate the analog circuit input via the analog input buffer.

In conjunction with the above-described testing of analog circuits, the voltmeter preferably includes a conventional digitizer for digitizing received analog signals so that the computer can use the digitized signals to perform conventional frequency domain analysis relative to the received analog signals.

While the example output buffers shown herein are high and low drive capable, it should be evident from the foregoing description that open drain or open collector buffers can be tested as well using the techniques of the present Disclosure.

Although exemplary embodiments of the present Disclosure are described above, this description does not limit the scope of the Disclosure, which can be practiced in a variety of embodiments.

What is claimed is:

1. An integrated circuit comprising:
A. a substrate of semiconductor material;
B. pads formed on the semiconductor material;
C. functional circuits formed on the substrate and having a functional input lead;
D. input buffer circuitry formed on the substrate, the input buffer circuitry having a buffer output lead connected to the functional input lead and having a buffer input lead coupled to an input pad;
E. electrostatic discharge circuitry coupled to the buffer input lead;
F. a serial scan path of scan cells formed on the substrate between a test data input lead and a test data output lead, both connected to a pad, some of the scan cells being switch cells;
G. test leads formed on the substrate and coupled to the pads;
H. a first switch cell coupling a first test lead to the buffer input lead between the electrostatic discharge circuitry and the input pad;
I. a second switch cell coupling a second test lead to the buffer input lead between the electrostatic discharge circuitry and the input pad; and
J. a third switch cell coupling a third test lead to the buffer output lead between the input buffer circuitry and the functional input lead.

2. The integrated circuit of claim 1 including a bus hold circuit connected to the buffer input lead between the buffer input and the electrostatic discharge circuitry.

3. The integrated circuit of claim 1 in which a scan cell is coupled to the functional input lead between the functional circuits and the input buffer circuitry.

* * * * *